US012812799B2

(12) United States Patent
Lee et al.

(10) Patent No.: US 12,812,799 B2
(45) Date of Patent: Nov. 24, 2026

(54) SLIDABLE ELECTRONIC DEVICE

(71) Applicant: SAMSUNG ELECTRONICS CO., LTD., Suwon-si (KR)

(72) Inventors: Wonho Lee, Suwon-si (KR); Joongyeon Cho, Suwon-si (KR); Hyunsuk Kim, Suwon-si (KR); Sanghyuk Park, Suwon-si (KR); Soohyun Seo, Suwon-si (KR); Hojin Jung, Suwon-si (KR); Baekeun Cho, Suwon-si (KR); Nakhyun Choi, Suwon-si (KR); Junghyeob Lee, Suwon-si (KR); Hyunju Hong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 94 days.

(21) Appl. No.: 18/829,100

(22) Filed: Sep. 9, 2024

(65) Prior Publication Data

US 2025/0008672 A1 Jan. 2, 2025

Related U.S. Application Data

(63) Continuation of application No. PCT/KR2023/002672, filed on Feb. 24, 2023.

(30) Foreign Application Priority Data

Mar. 10, 2022 (KR) ........................ 10-2022-0030196
Jul. 4, 2022 (KR) ........................ 10-2022-0081788

(51) Int. Cl.
*H05K 5/02* (2006.01)
*H05K 1/14* (2006.01)
(Continued)

(52) U.S. Cl.
CPC ............. *H05K 5/0217* (2013.01); *H05K 1/14* (2013.01); *H05K 5/0086* (2013.01); *H05K 7/1427* (2013.01)

(58) Field of Classification Search
CPC ............. H04M 1/0237; H04M 1/0239; H04M 1/0268; H04M 1/0277; G06F 1/1652;
(Continued)

(56) References Cited

U.S. PATENT DOCUMENTS 8,306,586 B2 * 11/2012 Ou ...................... H04M 1/0247 455/90.3
8,532,696 B2 * 9/2013 Lee ..................... H04M 1/0277 455/90.3
(Continued)

FOREIGN PATENT DOCUMENTS

JP 2008072382 A 3/2008
KR 20060042663 A 5/2006
(Continued)

OTHER PUBLICATIONS

Machine Translation of WO2015069801A1 (Year: 2026).*
(Continued)

*Primary Examiner* — Allen L Parker
*Assistant Examiner* — Peter Krim
(74) *Attorney, Agent, or Firm* — CANTOR COLBURN LLP

(57) ABSTRACT

An electronic device according to various embodiments of the present disclosure includes a first housing including a first support member and a second support member. The electronic device also includes a second housing that slides with respect to the first housing, a flexible display which is a display including a first display region and a second display region extending from the first display region, and which enables at least a part of the second display region to
(Continued)

be exposed on the basis of the slide movement of the second housing. The electronic device further includes a first circuit board arranged at the first support member and a second circuit board arranged at the second support member, where the second circuit board can be electrically connected to the first circuit board through a hole formed in one surface of the second support member.

18 Claims, 15 Drawing Sheets

(51) Int. Cl.
*H05K 5/00* (2025.01)
*H05K 7/14* (2006.01)

(58) Field of Classification Search
CPC .. G06F 1/1624; H05K 5/0217; H05K 5/0086; H05K 5/1427; H01Q 1/243; H01Q 1/244
See application file for complete search history.

(56) References Cited

U.S. PATENT DOCUMENTS

| | | | | |
|---|---|---|---|---|
| 10,111,346 | B2 | 10/2018 | Seo et al. | |
| 10,887,438 | B2 | 1/2021 | Baek et al. | |
| 10,904,371 | B1 | 1/2021 | Song et al. | |
| 2006/0097929 | A1 | 5/2006 | Chung | |
| 2007/0126644 | A1 | 6/2007 | Kim et al. | |
| 2008/0211721 | A1 | 9/2008 | Ohba et al. | |
| 2012/0162876 | A1 | 6/2012 | Kim | |
| 2015/0331451 | A1 | 11/2015 | Shin et al. | |
| 2017/0142239 | A1* | 5/2017 | Bae | G06F 1/1626 |
| 2019/0082536 | A1* | 3/2019 | Park | G06F 1/1698 |
| 2019/0261515 | A1* | 8/2019 | Son | H05K 1/0215 |
| 2019/0268455 | A1* | 8/2019 | Baek | G06F 1/1652 |
| 2020/0127387 | A1 | 4/2020 | Park et al. | |
| 2020/0218353 | A1 | 7/2020 | Song et al. | |
| 2020/0371558 | A1* | 11/2020 | Kim | H04M 1/0237 |
| 2021/0326569 | A1 | 10/2021 | Song et al. | |
| 2021/0405703 | A1* | 12/2021 | Song | G06F 1/1694 |
| 2022/0019261 | A1 | 1/2022 | Kang et al. | |
| 2022/0287193 | A1* | 9/2022 | Chun | H05K 5/0217 |
| 2023/0075423 | A1 | 3/2023 | Fujino et al. | |
| 2023/0231298 | A1* | 7/2023 | Choi | H01Q 1/243<br>343/702 |

FOREIGN PATENT DOCUMENTS

| | | | | |
|---|---|---|---|---|
| KR | 20060056456 | A | 5/2006 | |
| KR | 100683868 | B1 | 2/2007 | |
| KR | 20110032822 | A | 3/2011 | |
| KR | 20150136934 | A | 12/2015 | |
| KR | 20200045726 | A | 5/2020 | |
| KR | 20200085174 | A | 7/2020 | |
| KR | 20210150178 | A | 12/2021 | |
| KR | 20220008724 | A | 1/2022 | |
| WO | WO-2015068901 | A1 * | 5/2015 | H04B 1/38 |
| WO | 2021167236 | A1 | 8/2021 | |

OTHER PUBLICATIONS

International Search Report and Written Opinion for International Application No. PCT/KR2023/002672; International Filing Date Feb. 24, 2023; Date of Mailing Jun. 5, 2023, 62 Pages.

Extended European Search Report Issued In EP Application No. 23767059.1-1218; Mail Date Apr. 22, 2025; 06 Pages.

* cited by examiner

SLIDABLE ELECTRONIC DEVICE

CROSS-REFERENCE TO RELATED APPLICATIONS

This application is a continuation application, claiming priority under § 365 (c), of International Application No. PCT/KR2023/002672 filed on Feb. 24, 2023, which is based on and claims the benefit of Korean patent application number 10-2022-0081788 filed on Jul. 4, 2022, in the Korean Intellectual Property Office and of Korean patent application number 10-2022-0030196 filed on Mar. 10, 2022, in the Korean Intellectual Property Office, the disclosures of which are incorporated by reference herein in their entireties.

BACKGROUND

The disclosure relates to a slidable electronic device, and more particularly, to an electronic device including a flexible display with a screen display area of a variable size.

An electronic device (e.g., portable phone) may output information as sound or an image. As the integration level of electronic devices increases and high-speed, large-capacity wireless communication becomes more common, a single electronic device such as a mobile communication terminal may be equipped with various functions in recent years. For example, in addition to a communication function, an entertainment function such as games, a multimedia function such as music/video playback, a communication and security function such as mobile banking, or a function such as schedule management or an electronic wallet is integrated into a single electronic device.

An electronic device is generally equipped with a flat display device and a battery, and has a bar-type, folder-type, or sliding-type appearance due to the shape of the display device or the battery. Recently, electronic devices with large screens have emerged so that users may comfortably watch videos.

In order to conveniently carry electronic devices with such large screens, electronic devices using flexible displays (or variable displays) are commercialized. An electronic device may include a flexible display to visually provide various screens through the flexible display. The flexible display may include a display panel and a display driver integrated circuit (DDI) to drive the display panel. The DDI mounted on the electronic device may receive display data from a processor and drive the display panel.

Unlike an existing foldable structure, in an electronic device equipped with a flexible display (or variable display), the flexible display may be accommodated partially rolled inside a housing. The flexible display is accommodated rolled inside the housing, and guide structures that guide the flexible display are disposed at both width-direction ends of the flexible display.

Various antennas and coils may be disposed outside of the housing, and even though these electrical components should be electrically connected to a printed circuit board disposed inside the housing, the flexible display and the guide structures may make it difficult to electrically connect the inside and outside of the housing by wire.

SUMMARY

According to various embodiments of the disclosure, an electronic device may provide a structure in which an electrical component disposed outside a housing and a printed circuit board disposed inside the housing are electrically connected by wire.

An electronic device according to various embodiments includes a first housing including a first support member and a second support member, a second housing configured to slide relative to the first housing, a flexible display including a first display area and a second display area extending from the first display area, and configured to allow at least a portion of the second display area to be exposable based on the slide movement of the second housing, a first circuit board disposed on the first support member, and a second circuit board disposed on the second support member. The second circuit board is electrically connected to the first circuit board through a hole formed on one surface of the second support member.

An electronic device according to various embodiments includes a first housing including a first cover member to mount electrical components thereon, a second housing configured to slide relative to the first housing, a display including a first display area and a second display area extending from the first display area, and configured to allow at least a portion of the second display area to be exposable based on the slide movement of the second housing, a first circuit board disposed inside the first cover member, a second circuit board disposed outside the first cover member, and an antenna module disposed outside the first cover member and connected to the second circuit board. At least a portion of the second circuit board is electrically connected to the first circuit board through a hole formed on the first cover member.

According to various embodiments of the disclosure, an electronic device may provide a structure in which a hole is formed on a housing, and an electrical component disposed outside the housing is electrically connected to a printed circuit board disposed inside the housing through the hole by wire.

DETAILED DESCRIPTION

Figure 1:
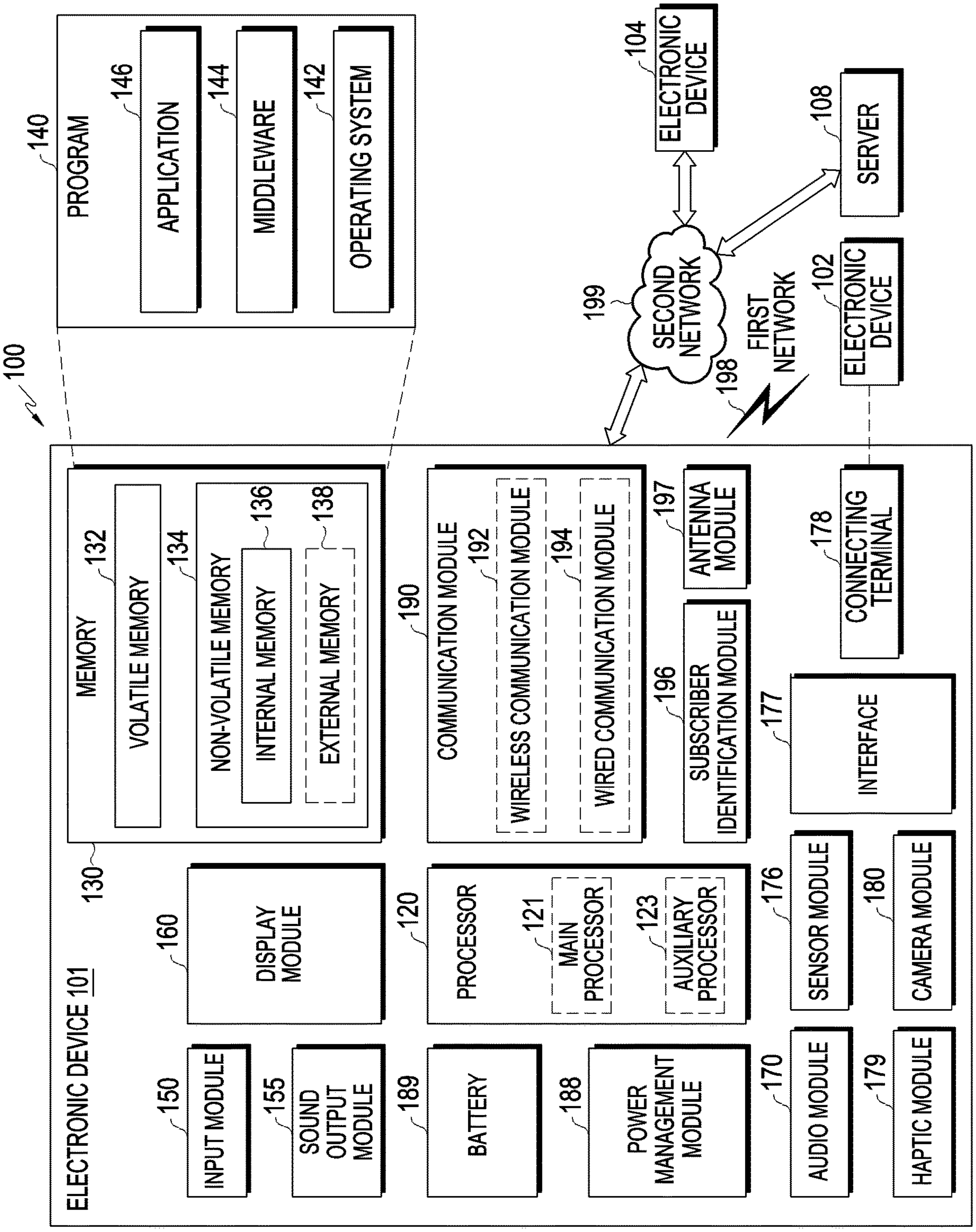
FIG. 1 is a block diagram illustrating an electronic device in a network environment according to various embodiments of the disclosure.

FIG. 1 is a block diagram illustrating an electronic device 101 in a network environment 100 according to various embodiments of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the strength of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a printed circuit board (e.g., a PCB). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to an embodiment, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to a particular embodiment and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities, and some of the multiple entities may be separately disposed in different components. According to an embodiment, one or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

An embodiment of the disclosure described later may be applied to any electronic device with a variable size of a screen area displayed on a front surface thereof. According to an embodiment, an electronic device having a rollable display, in which a flexible display is rolled to an opposite side will be described as an exemplary electronic device in an embodiment described later.

Figure 2:
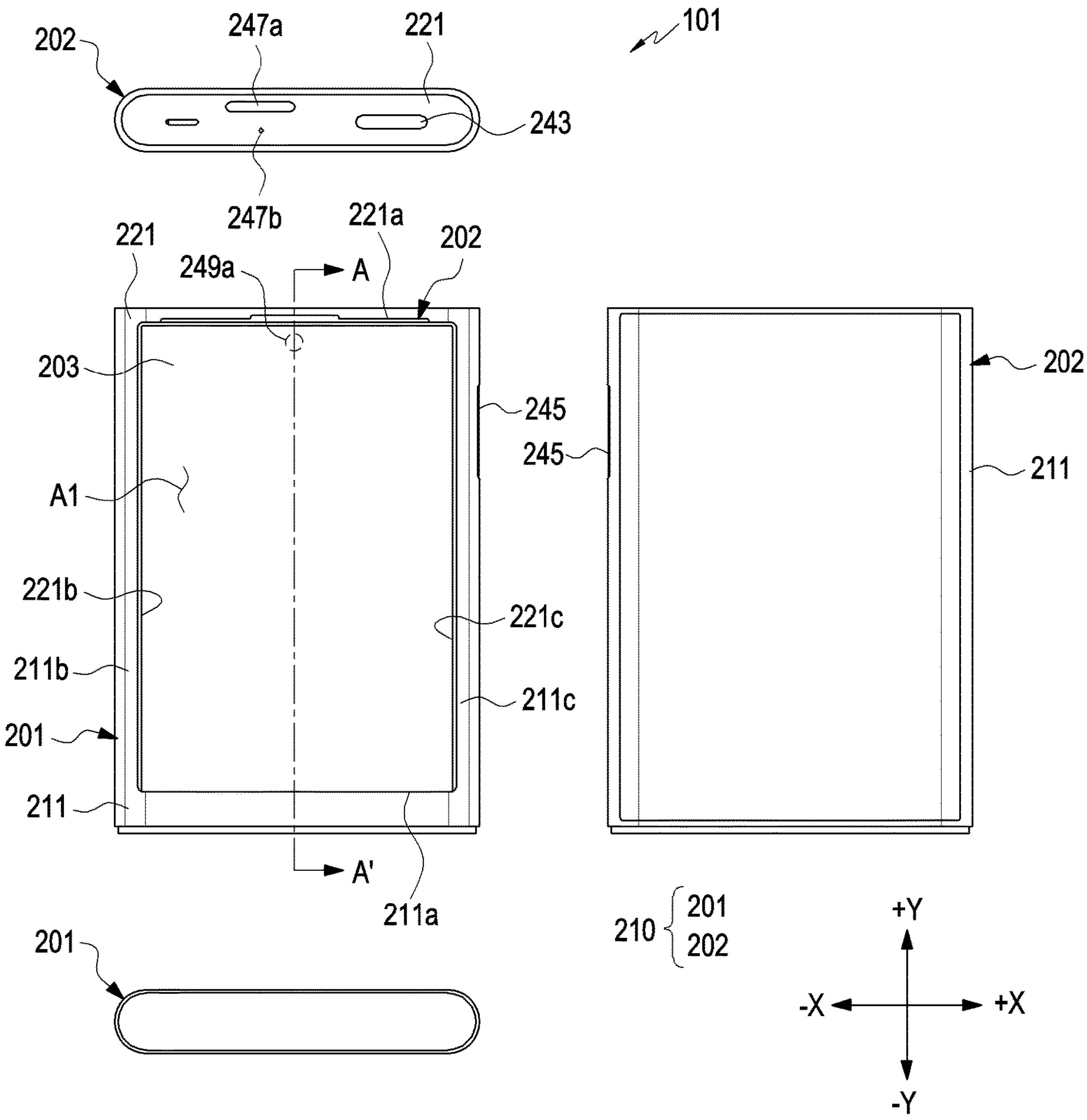
FIG. 2 is a diagram illustrating a state in which a second display area of a display is accommodated in a housing according to various embodiments of the disclosure.

FIG. 2 is a diagram illustrating a state in which a second display area of a display is accommodated in a housing according to various embodiments of the disclosure.

Figure 3:
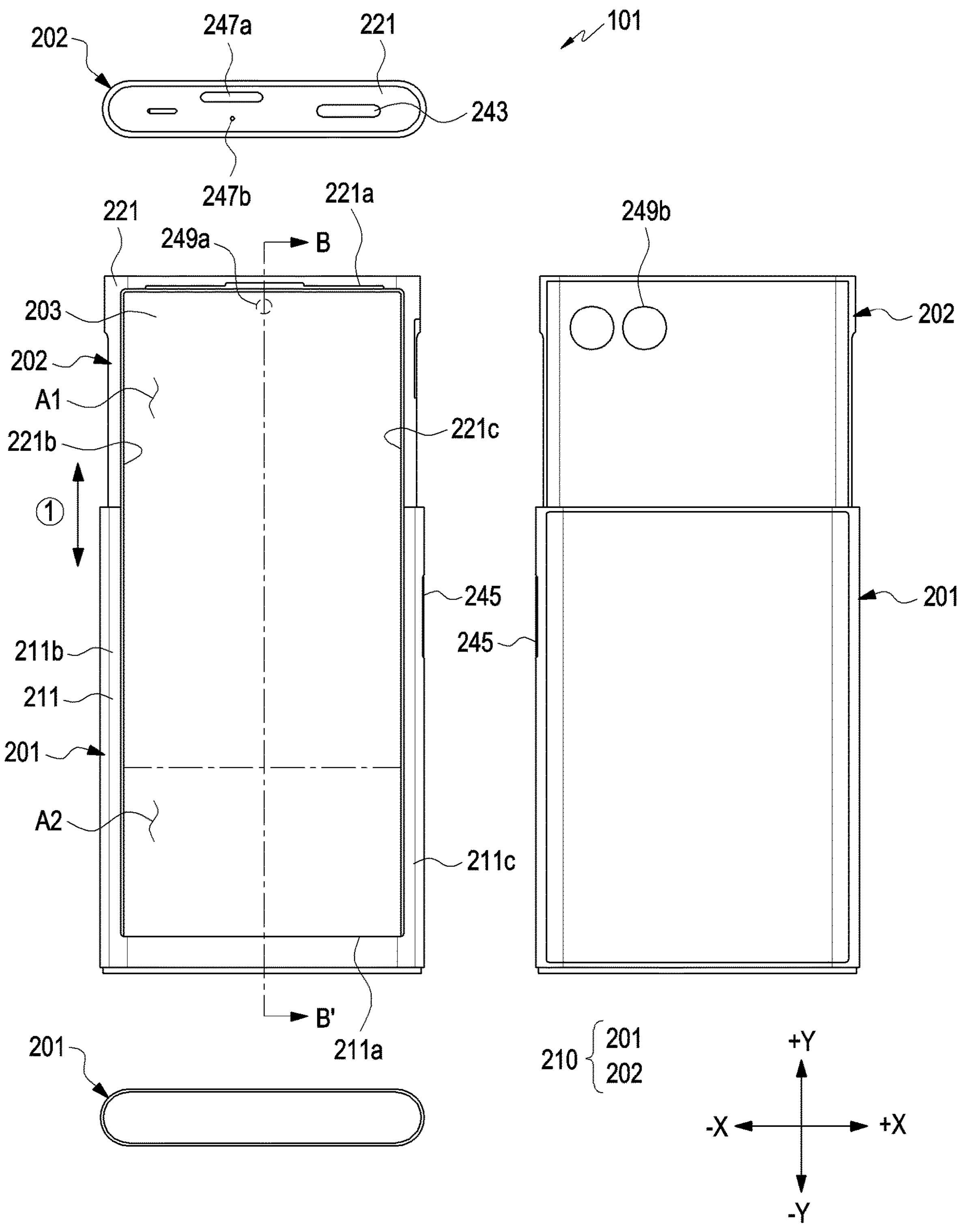
FIG. 3 is a diagram illustrating a state in which a second display area of a display is exposed to the outside of a housing according to various embodiments of the disclosure.

FIG. 3 is a diagram illustrating a state in which the second display area of the display is exposed to the outside of the housing according to various embodiments of the disclosure.

FIGS. 2 and 3 illustrate a structure in which a display 203 (e.g., a flexible display or rollable display) extends in a longitudinal direction (e.g., +Y direction), when viewed from the front of the electronic device 101. However, the direction of extension of the display 203 is not limited to one direction (e.g., +Y direction). For example, a design modification may be made such that the display 203 is extendable in an upward direction (e.g., +Y direction), a right direction (e.g., +X direction), a left direction (e.g., −X direction), and/or a downward direction (e.g., −Y direction).

The state illustrated in FIG. 2 may be defined as a closed state of the electronic device 101 or a housing 210, and a slide-in state of the display 203.

The state illustrated in FIG. 3 may be defined as an opened state of the electronic device 101 or the housing 210, and a slide-out state of the display 203.

Referring to FIGS. 2 and 3, the electronic device 101 may include the housing 210. The housing 210 may include a first housing 201 and a second housing 202 movable with respect to the first housing 201. In some embodiments, it may be interpreted as a structure in which the first housing 201 is disposed slidably with respect to the second housing 202 in the electronic device 101. According to an embodiment, the second housing 202 may be disposed to be reciprocable by a predetermined distance in a direction illustrated with respect to the first housing 201, for example, in a direction indicated by an arrow ① shown in FIG. 3.

According to various embodiments, the second housing 202 may be referred to as, for example, a slide part or a slide housing, and disposed to be movable relative to the first housing 201. According to an embodiment, the second housing 202 may accommodate various electrical and electronic components such as a circuit board or a battery.

According to an embodiment, a motor, a speaker, a SIM socket, and/or a sub-circuit board electrically connected to a main circuit board may be disposed in the first housing 202. The second housing 202 may accommodate the main circuit board with electrical components such as an AP and a CP mounted thereon.

According to various embodiments, the first housing may include a first cover member 211 (e.g., a main case). The first cover member 211 may include a first sidewall 211*a*, a second sidewall 211*b* extending from the first sidewall 211*a*, and a third sidewall 211*c* extending from the first sidewall 211*a* and substantially parallel to the second sidewall 211*b*. According to an embodiment, the second sidewall 211*b* and the third sidewall 211*c* may be formed substantially perpendicular to the first sidewall 211*a*.

According to various embodiments, the first sidewall 211*a*, the second sidewall 211*b*, and the third sidewall 211*c* of the first cover member 211 may be formed with one side (e.g., a front surface) open to accommodate (or surround) at least a portion of the second housing 202. For example, the second housing 202 may be at least partially surrounded by the first housing 201 and slide in a direction parallel to a first surface (e.g., a first surface F1 in FIG. 4), for example, in the direction of the arrow ①, while being guided by the first housing 201. According to an embodiment, the first sidewall 211*a*, the second sidewall 211*b*, and/or the third sidewall 211*c* of the first cover member 211 may be integrally formed. According to another embodiment, the first sidewall 211*a*, the second sidewall 211*b*, and/or the third sidewall 211*c* of the first cover member 211 may be formed as separate housings and combined or assembled.

According to an embodiment, the first cover member 211 may cover at least a portion of the display 203. For example, at least a portion of the display 203 may be formed to be surrounded by the first sidewall 211*a*, the second sidewall 211*b*, and/or the third sidewall 211*c* of the first cover member 211

According to various embodiments, the second housing 202 may include a second cover member 221 (e.g., a slide plate). The second cover member 221 may be plate-shaped and include the first surface (e.g., the first surface F1 in FIG. 4) supporting internal components. For example, the second cover member 221 may support at least a portion (e.g., a first display area A1) of the display 203. According to an embodiment, the second cover member 221 may be referred to as a front cover.

According to an embodiment, the second cover member 221 may include a first sidewall 221*a*, a second sidewall 221*b* extending from the first sidewall 221*a*, and a third sidewall 221*c* extending from the first sidewall 221*a* and substantially parallel to the second sidewall 221*b*. According to an embodiment, the second sidewall 221*b* and the third sidewall 221*c* may be formed substantially perpendicular to the first sidewall 221*a*.

According to various embodiments, as the second housing 202 moves in a first direction (e.g., the direction ① parallel to the second sidewall 211*b* or the third sidewall 211*c*, it may place the housing 210 in the opened state and the closed state. The second housing 202 is movable to be located at a first distance from the first sidewall 211*a* of the first housing 201 in the closed state and at a second distance larger than the first distance from the first sidewall 211*a* in the opened state. In some embodiments, the first housing 201 may be formed to surround a portion of the first sidewall 221*a* in the closed state.

According to various embodiments, the electronic device 101 may include the display 203, key input devices 245, a connector hole 243, audio modules 247*a* and 247*b*, or camera modules 249*a* and 249*b*. According to an embodiment, the electronic device 101 may further include an indicator (e.g., an LED device) or various sensor modules.

According to various embodiments, the display 203 may include the first display area A1 and a second display area A2 configured to be exposed to the outside of the electronic device based on slide movement of the second housing 202. According to an embodiment, the first display area A1 may be disposed on the second housing 202. According to an embodiment, the second display area A2 may extend from the first display area A1, and may be accommodated into the first housing 201 (e.g., the slide-in state) or visually exposed to the outside of the electronic device 101 (e.g., the slide-out state), as the second housing 202 slides with respect to the first housing 201.

According to various embodiments, the second display area A2 may move while being guided substantially by an area (e.g., a curved surface 213*a* in FIG. 4), and may be accommodated into the first hosing 201 or exposed to the outside of the electronic device 101. According to an embodiment, the second display area A2 may move based on slide movement of the second housing 202 in the first direction (e.g., the direction indicated by the arrow (1). For example, a portion of the second display area A2 may be deformed into a curved surface at a position corresponding to the curved surface 213*a* of the first housing 201 during slide movement of the second housing 202.

According to various embodiments, when viewed from above the second cover member 221 (e.g., a front cover), when the housing 210 is changed from the closed state to the opened state (e.g., when the second housing 202 slides to extend from the first housing 201), the second display area A2 may form a substantially flat surface with the first display area A1, while gradually being exposed to the outside of the second housing 202. According to an embodiment, the display 203 may be coupled to or disposed adjacent to a touch sensing circuit, a pressure sensor capable of measuring the intensity (pressure) of a touch, and/or a digitizer that detects a magnetic stylus pen. According to an embodiment, regardless of the closed or opened state, an exposed portion of the second display area A2 may be located on a portion (e.g., the curved surface 213*a* in FIG. 4) of the first housing, and maintain the shape of the curved surface at the position corresponding to the curved surface 213*a*.

According to various embodiments, the key input devices 245 may be located in an area of the first housing 201. Depending on the appearance and a use state, the electronic device 101 may be designed to be without the illustrated key input devices 245 or to include additional key input device (s). According to an embodiment, the electronic device 101 may include a key input device not shown, such as a home key button or a touch pad disposed around the home key button. According to an embodiment, at least some of the key input devices 245 may be disposed on the first sidewall 211*a*, the second sidewall 211*b*, and/or the third sidewall 211*c* of the first housing 201.

According to various embodiments, the connector hole 243 may be omitted according to an embodiment, and may accommodate a connector (e.g., a USB connector) for transmitting power and/or data to and from an external electronic device. According to an embodiment (not shown), the electronic device 101 may include a plurality of connector holes 243, and some of the plurality of connector holes 243 may function as connector holes for transmitting and receiving audio signals to and from an external electronic device. In the illustrated embodiment, the connector hole 243 is disposed on the second housing 202, to which the disclosure is not limited. The connector hole 243 or a connector hole not shown may be disposed on the first housing 201.

According to various embodiments, the audio modules 247*a* and 247*b* may include at least one speaker hole 247*a* or at least one microphone hole 247*b*. One of the speaker holes 247*a* may be provided as a receiver hole for voice calls, and the other may be provided as an external speaker hole. The electronic device 101 may include a microphone for obtaining sound, and the microphone may obtain sound external to the electronic device 101 through the microphone hole 247*b*. According to an embodiment, the electronic device 101 may include a plurality of microphones to detect the direction of sound. According to an embodiment, the electronic device 101 may include an audio module in which the speaker hole 247*a* and the microphone hole 247*b* are implemented as a single hole, or include a speaker (e.g., a piezo speaker) without the speaker hole 247*a*.

According to various embodiments, the camera modules 249*a* and 249*b* may include a first camera module 249*a* and a second camera module 249*b*. According to an embodiment, the electronic device 101 may include at least one of a wide-angle camera, a telephoto camera, or a close-up camera, and according to an embodiment, include an IR projector and/or an IR receiver to measure a distance to a subject. The camera modules 249*a* and 249*b* may include one or more lenses, an image sensor, and/or an image signal processor. The first camera module 249*a* may be disposed to face in the same direction as the display 203. For example, the first camera module 249*a* may be disposed around the first display area A1 or in an area overlapping the display 203 and, when disposed in the area overlapping the display 203, may be able to capture a subject through the display 203. According to an embodiment, the first camera module 249*a* may not be visually exposed to a screen display area (e.g., the first display area A1) and include a hidden under display camera (UDC). According to an embodiment, the second camera module 249*a* may capture a subject in a direction opposite to the display A1. According to an embodiment, the first camera module 249*a* and/or the second camera module 249*b* may be disposed on the second housing 202.

According to various embodiments, an indicator (not shown) of the electronic device 101 may be disposed in the first housing 201 or the second housing 202, and include an LED to provide state information about the electronic device 101 as a visual signal. A sensor module (not shown) of the electronic device 101 may generate an electrical signal or data value corresponding to an internal operational state or an external environmental state of the electronic device 101. The sensor module may include, for example, a proximity sensor, a fingerprint sensor, or a biometric sensor (e.g., an iris/facial recognition sensor or an HRM sensor). In another embodiment, the sensor module may further include at least one of, for example, a gesture sensor, a gyro sensor, a barometric pressure sensor, a magnetic sensor, an acceleration sensor, a grip sensor, a color sensor, an IR sensor, a temperature sensor, a humidity sensor, or an illuminance sensor.

Figure 4:
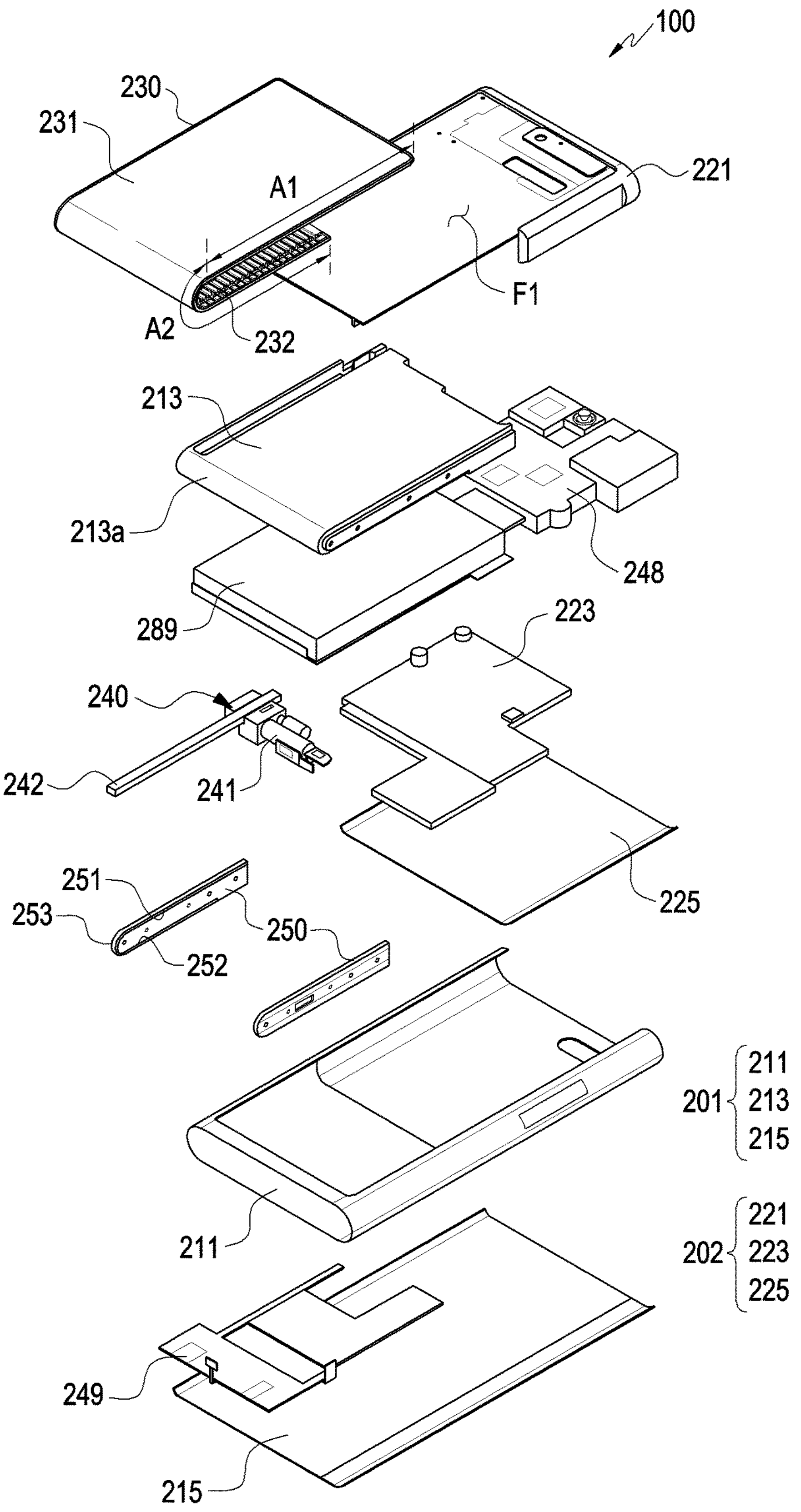
FIG. 4 is a disassembled perspective view illustrating an electronic device according to various embodiments of the disclosure.

FIG. 4 is a disassembled perspective view illustrating an electronic device according to various embodiments of the disclosure.

Figure 5A:
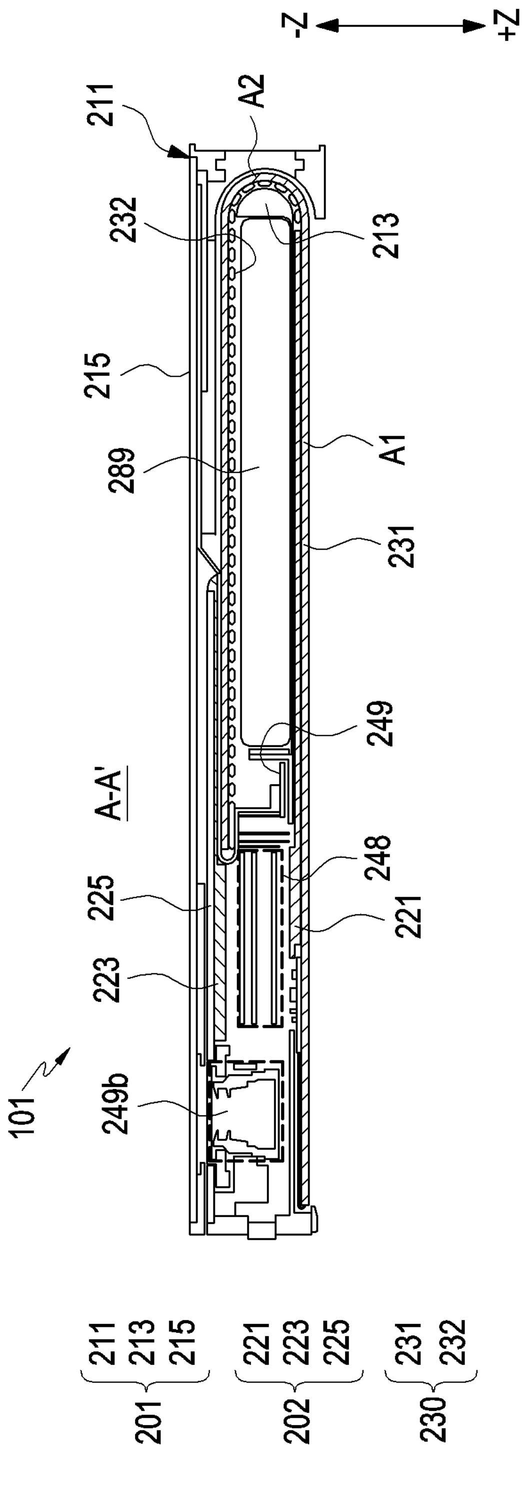
FIG. 5A is a cross-sectional view taken along line A-A' of FIG. 2 according to various embodiments of the disclosure.

FIG. 5A is a cross-sectional view taken along line A-A' of FIG. 2 according to various embodiments of the disclosure.

Figure 5B:
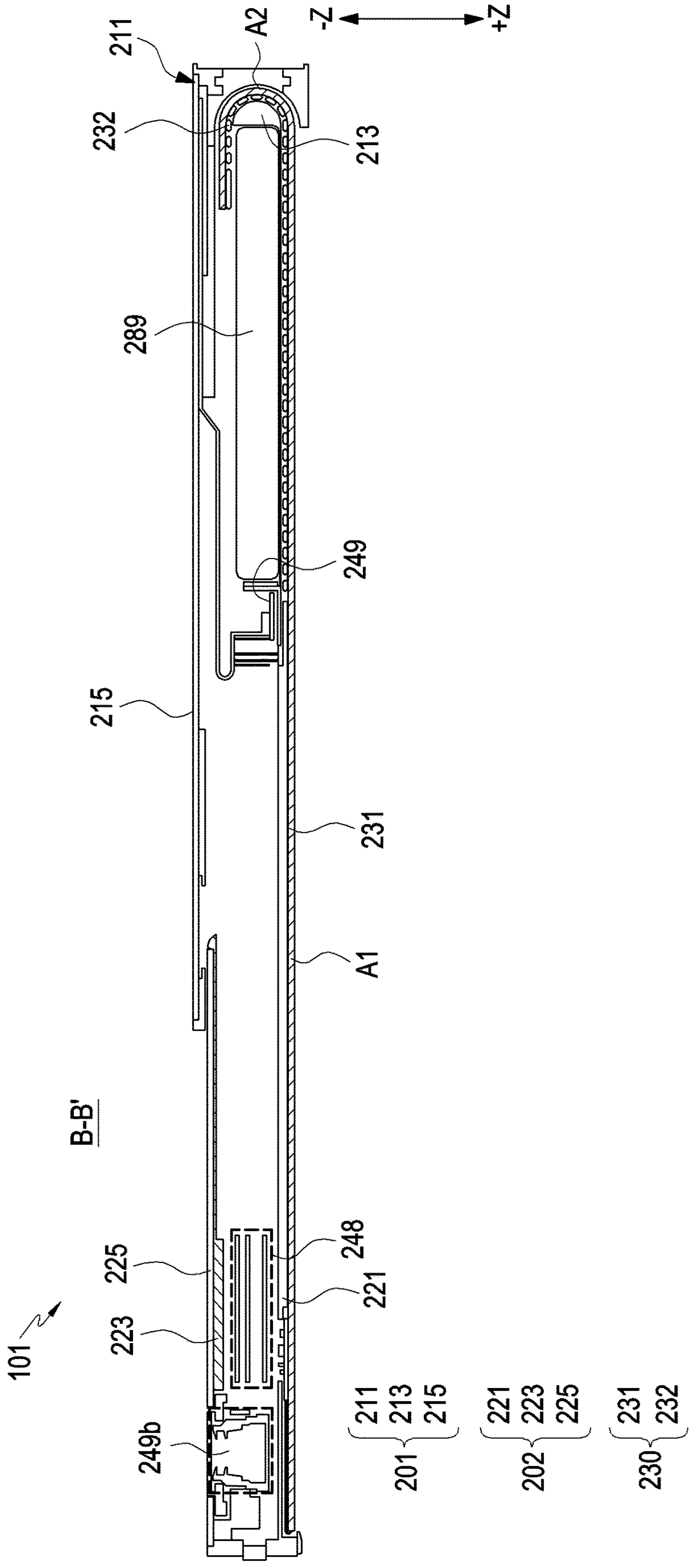
FIG. 5B is a cross-sectional view taken along line B-B' of FIG. 3 according to various embodiments of the disclosure.

FIG. 5B is a cross-sectional view taken along line B-B' of FIG. 3 according to various embodiments of the disclosure.

Referring to FIG. 4, FIG. 5A, and/or FIG. 5B, the electronic device 101 may include the first housing 201, the second housing 202, a display assembly 230, and a driving structure 240. The configurations of the first housing 201, the second housing 202, and the display assembly 230 in FIG. 4, FIG. 5A, and/or FIG. 5B may be wholly or partially identical to those of the first housing 201, the second housing 202, and the display 203 in FIG. 2 and/or FIG. 3.

According to various embodiments, the first housing 201 may include a first support member and a second support member. The first support member may correspond to a frame 213 of FIG. 4, FIG. 5A and/or FIG. 5B, and the second support member may correspond to the first cover member 211 of FIG. 4, FIG. 5A and/or FIG. 5B. According to an embodiment, the first housing 201 may include the first cover member 211 (e.g., the first cover member 211 in FIGS. 2 and 3), the frame 213, and a first rear plate 215.

According to various embodiments, the first cover member 211 may accommodate at least a portion of the frame 213 and a component (e.g., a battery 289) located on the frame 213. According to an embodiment, the first cover member 211 may be formed to surround at least a portion of the second housing 202. According to an embodiment, a sub-circuit board 249 accommodating electronic components (e.g., the processor 120 and/or the memory 130 in FIG. 1) may be connected to the first cover member 211.

According to various embodiments, the frame 213 may be connected to the first cover member 211. For example, the frame 213 may be connected to the first cover member 211, and the second housing 202 may move relative to the first cover member 211 and/or the frame 213. According to an embodiment, the frame 213 may accommodate the battery 289. According to an embodiment, the frame 213 may include the curved surface **213*a* facing the display assembly 230**.

According to various embodiments, the first rear plate 215 may substantially form at least a portion of the exterior of the first housing 201 or the electronic device 101. For example, the first rear plate 215 may be coupled to an outer surface of the first cover member 221. According to an embodiment, the first rear plate 215 may provide a decorative effect on the exterior of the electronic device 101. The first rear plate 215 may be manufactured using at least one of metal, glass, synthetic resin, or ceramic.

According to various embodiments, the second housing 202 may include the second cover member 221 (e.g., the second cover member 221 in FIGS. 2 and 3), a rear cover 223, and a second rear plate 225.

According to an embodiment, the second cover member 221 may be connected to the first housing 201 through a guide rail 250 and reciprocate in a straight line in one direction (e.g., the direction of the arrow ① in FIG. 3) while being guided by the guide rail 250.

According to various embodiments, the second cover member 221 may support at least a portion of the display 203. For example, the second cover member 221 may include the first surface F1, and the first display area A1 of the display 203 may be substantially located on the first surface F1 and maintained in a flat shape. According to an embodiment, the second cover member 221 may be formed of a metallic material and/or a non-metallic (e.g., polymer) material. According to an embodiment, a main circuit board 248 accommodating electronic components (e.g., the processor 120 and/or the memory 130 in FIG. 1) may be connected to the second cover member 221.

According to various embodiments, the rear cover 223 may protect components (e.g., the main circuit board 248) located on the second cover member 221. For example, the rear cover 223 may be connected to the second cover member 221 and formed to surround at least a portion of the main circuit board 248. According to an embodiment, the rear cover 223 may include an antenna pattern to communicate with an external electronic device. For example, the rear cover 223 may include a laser direct structuring (LDS) antenna.

According to various embodiments, the second rear plate 225 may substantially form at least a portion of the exterior of the second housing 202 or the electronic device 101. For example, the second rear plate 225 may be coupled to an outer surface of the second cover member 221. According to an embodiment, the second rear plate 225 may provide a decorative effect on the exterior of the electronic device 101. The second rear plate 215 may be manufactured using at least one of metal, glass, synthetic resin, or ceramic.

According to various embodiments, the display assembly 230 may include a display 231 (e.g., the display 203 in FIG. 2 and/or FIG. 3) and a multi-bar structure 232 supporting the display 203. According to an embodiment, the display 231 may be referred to as a flexible display, a foldable display, and/or a rollable display.

According to various embodiments, the multi-bar structure 232 may be connected or attached to at least a portion (e.g., the second display area A2) of the display 231. According to an embodiment, as the second housing 202 slides, the multi-bar structure 232 may move relative to the first housing 201. In the closed state of the electronic device 101 (e.g., FIG. 2), most of the multi-bar structure 232 may be accommodated inside the first housing 201 and located between the first cover member 211 and the second cover member 221. According to an embodiment, at least a portion of the multi-bar structure 232 may move in correspondence with the curved surface **213*a* located at an edge of the frame 213. According to an embodiment, the multi-bar structure 232** may be referred to as a display support member or a support structure, and may be in the form of one elastic plate.

According to various embodiments, the driving structure 240 may move the second housing 202 relative to the first housing 201. For example, the driving structure 240 may include a motor 241 configured to generate a driving force for slide movement of the housing 201 and 202. The driving structure 240 may include a gear (e.g., a pinion) connected to the motor 241 and a rack 242 configured to mesh with the gear.

According to various embodiments, a housing in which the rack 242 is located may be different from a housing in which the motor 241 is located. According to an embodiment, the motor 241 may be connected to the second housing 202, and the rack 242 may be connected to the first housing 201. According to another embodiment, the motor 241 may be connected to the first housing 201, and the rack 242 may be connected to the second housing 202.

According to various embodiments, the second housing 202 may accommodate the main circuit board 248. According to an embodiment, a processor, memory, and/or an interface may be mounted on the main circuit board 248. The processor may include, for example, one or more of a CPU, an AP, a GPU, an ISP, a sensor hub processor, or a CP. According to various embodiments, the main circuit board 248 may include a flexible printed circuit board type radio frequency cable (FRC). The main circuit board 248 may be disposed on at least a portion of the second cover member 221 and electrically connected to an antenna module and a communication module.

According to an embodiment, the memory may include, for example, volatile memory or non-volatile memory.

According to an embodiment, the interface may include, for example, an HDMI, a USB interface, an SD card interface, and/or an audio interface. For example, the interface may electrically or physically connect the electronic device 101 to an external electronic device and include a USB connector, an SD card/MMC connector, or an audio connector.

According to various embodiments, the electronic device 101 may include the sub-circuit board 249 within the first housing 201, spaced apart from the main circuit board 248. The sub-circuit board 249 may be electrically connected to the main circuit board 248 through a connection board (e.g., a flexible board). The sub-circuit board 249 may be electrically connected to electrical components disposed in an end area of the electronic device 101, such as the battery 289 or a speaker and/or a SIM socket, to transmit signals and power. According to an embodiment, the sub-circuit board 249 may accommodate or be connected to a wireless charging antenna (e.g., a coil). For example, the battery 289 may receive power from an external electronic device using the wireless charging antenna. In another example, the battery 289 may transfer power to an external electronic device using the wireless charging antenna.

According to various embodiments, the battery 289, which is a device for supplying power to at least one component of the electronic device 101, may be a non-rechargeable primary battery, a rechargeable secondary battery, or a fuel cell. The battery 289 may be disposed integrally within the electronic device 101 or detachably from the electronic device 101. According to an embodiment, the battery 289 may be formed as a single integrated battery or include a plurality of separate batteries. According to an embodiment, the battery 289 may be located on the frame 213. According to another embodiment, the battery 289 may be located within the second housing 202 and slide together with the second housing 202.

According to various embodiments, the guide rail 250 may guide movement of the multi-bar structure 232. For example, the multi-bar structure 232 may slide along a slit 251 formed on the guide rail 250. According to an embodiment, the guide rail 250 may be connected to the first housing 201. For example, the guide rail 250 may be connected to the first cover member 211 and/or the frame 213. According to an embodiment, the slit 251 may be referred to as a groove or recess formed on an inner surface of the guide rail 250.

According to various embodiments, the guide rail 250 may provide pressure to the multi-bar structure 233 based on driving of the motor 241.

According to an embodiment, when the electronic device 101 is changed from the closed state to the opened state, an inner portion 252 of the guide rail 250 may provide pressure to the multi-bar structure 232. The multi-bar structure 232 receiving the pressure may move along the slit 251 of the guide rail 250, and the second housing 202 may be changed from the slide-in state to the slide-out state with respect to the first housing 201. At least a portion of the display assembly 230 accommodated between the first cover member 211 and the frame 213 may extend to the front surface.

According to an embodiment, when the electronic device 101 is changed from the opened state to the closed state, an outer portion 253 of the guide rail 250 may provide pressure to the bent multi-bar structure 232. The multi-bar structure 232 receiving the pressure may move along the slit 251 of the guide rail 250, and the second housing 202 may be changed from the slide-out state to the slide-in state with respect to the first housing 201. At least a portion of the display assembly 230 may be accommodated between the first cover member 211 and the frame 213.

Referring to FIG. 5A, in the closed state of the electronic device 101, at least a portion of the second housing 202 may be disposed to be accommodated in the first housing 201. As the second housing 202 is disposed to be accommodated in the first housing 201, the overall volume of the electronic device 101 may be reduced. According to an embodiment, when the second housing 202 is accommodated in the first housing 201, the visually exposed size of the display 231 may be minimized. For example, when the second housing 202 is fully accommodated in the first housing 201, the first display area A1 of the display 231 may be visually exposed, and the second display area A2 may not be visually exposed. At least a portion (e.g., a portion facing the −Z axis) of the second display area A2 may be disposed between the battery 289 and the first rear plate 215.

Referring to FIG. 5B, in the opened state of the electronic device 101, at least a portion of the second housing 202 may protrude from the first housing 201. As the second housing 202 protrudes from the first housing 201, the overall volume of the electronic device 101 may increase. According to an embodiment, when the second housing 202 protrudes from the first housing 201, at least a portion of the second display area A2 of the display 231 may be visually exposed together with the first display area A1 to the outside of the electronic device 101.

Figure 6:
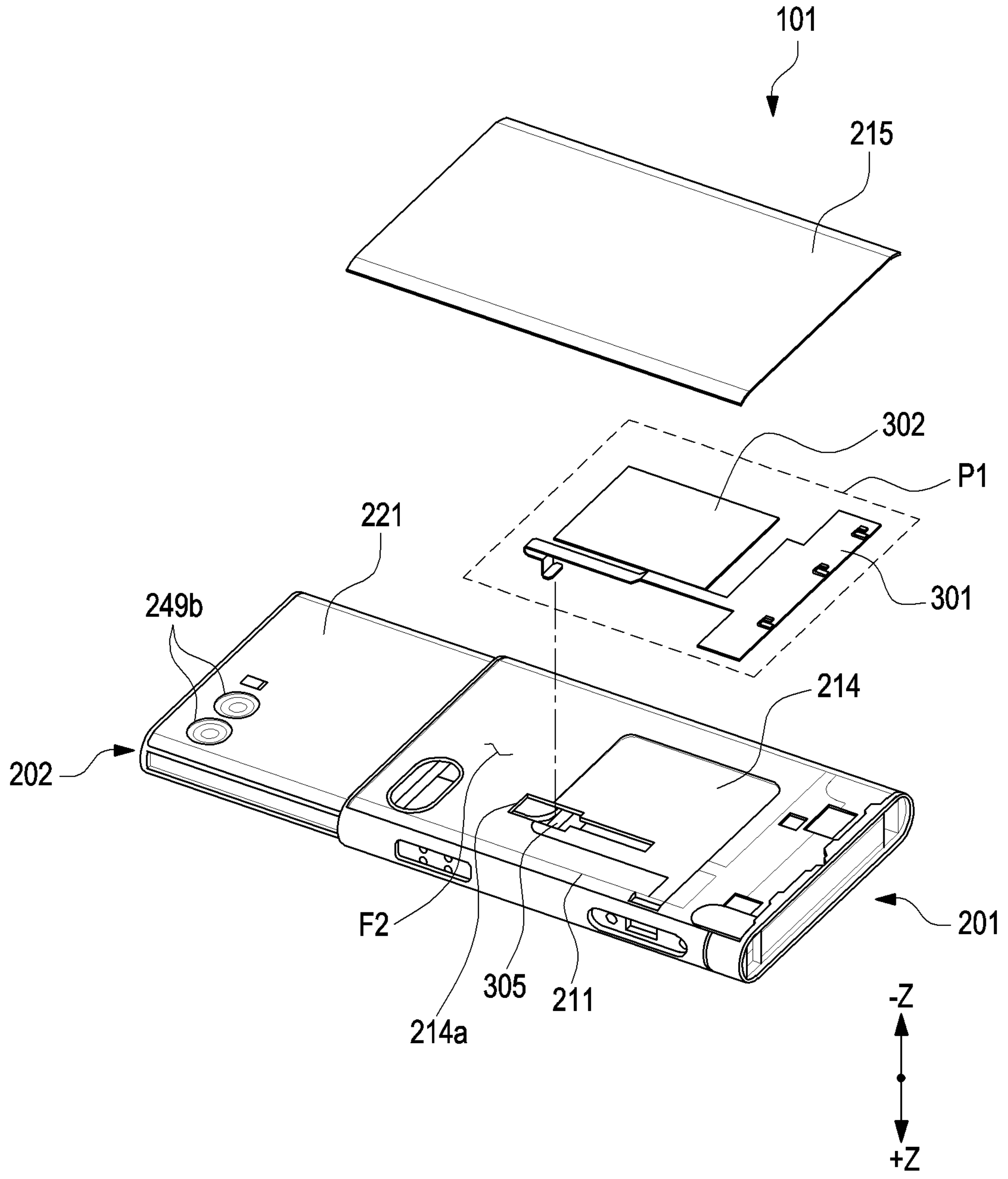
FIG. 6 is a disassembled perspective view illustrating a second circuit board and a first rear plate which are separated from a first cover member in an opened state of an electronic device according to various embodiments of the disclosure.

FIG. 6 is a disassembled perspective view illustrating a second circuit board and a first rear plate which are separated from a first cover member in an opened state of an electronic device according to various embodiments of the disclosure.

Figure 7:
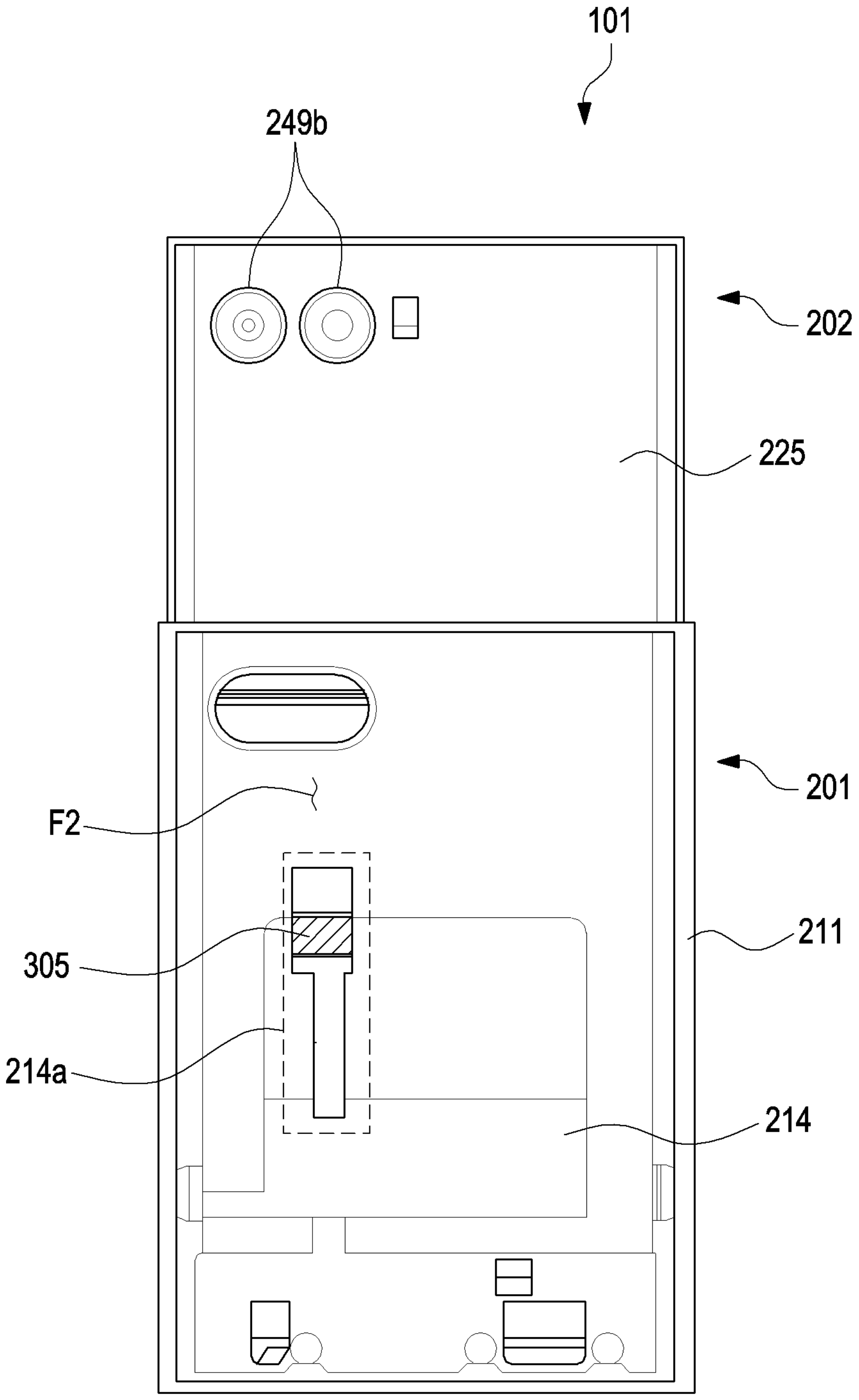
FIG. 7 is a diagram illustrating a bottom surface of an electronic device with a first rear plate excluded therefrom in an opened state of the electronic device according to various embodiments of the disclosure.

FIG. 7 is a diagram illustrating a bottom surface of the electronic device with the first rear plate excluded therefrom in the opened state of the electronic device according to various embodiments of the disclosure.

Figure 8:
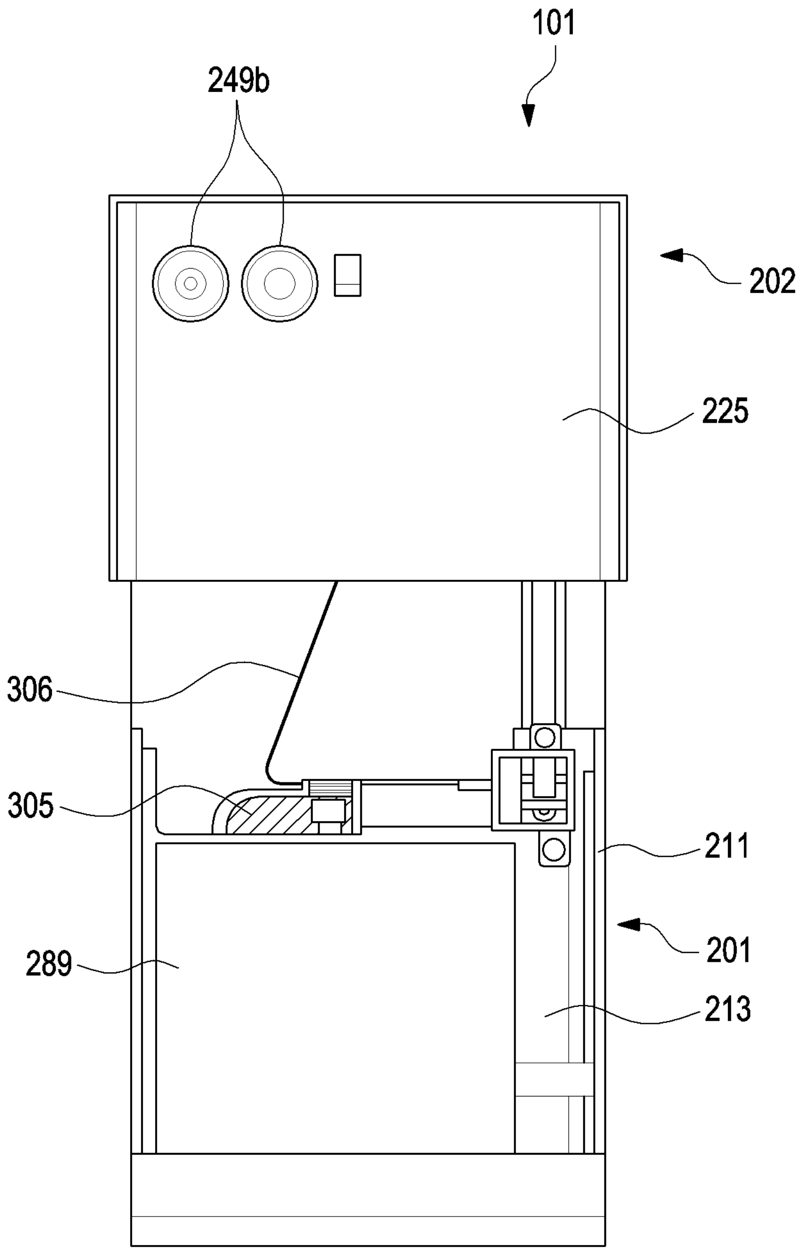
FIG. 8 is a diagram illustrating a bottom surface of an electronic device with a first rear plate and a first cover member excluded therefrom in an opened state of the electronic device according to various embodiments of the disclosure.

FIG. 8 is a diagram illustrating the bottom surface of the electronic device with the first rear plate and the first cover member excluded therefrom in the opened state of the electronic device according to various embodiments of the disclosure.

Figure 9:
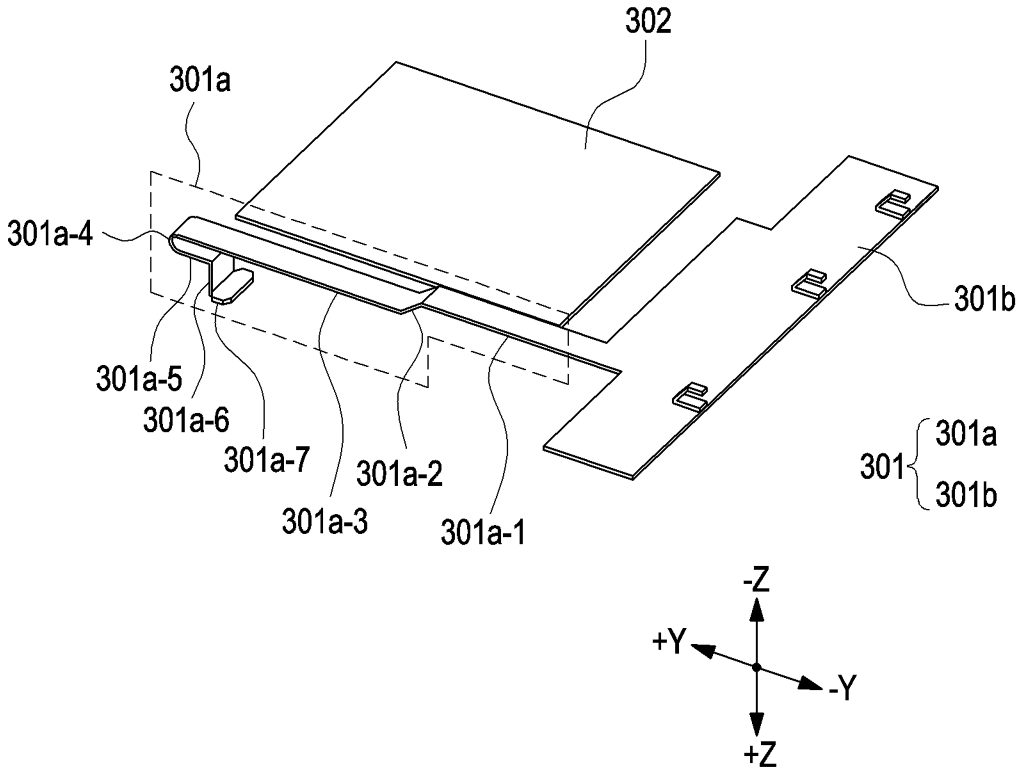
FIG. 9 is an enlarged perspective view illustrating a structure P1 of a second circuit board and antenna module in FIG. 6 according to various embodiments of the disclosure.

FIG. 9 is an enlarged perspective view illustrating a structure P1 of the second circuit board and antenna module in FIG. 6 according to various embodiments of the disclosure.

Referring to FIG. 6, FIG. 7, FIG. 8, and/or FIG. 9, the electronic device 101 may include the first housing 201, the second housing 202, and an electrical structure (e.g., a second circuit board 301 and/or an antenna module 302) disposed on one surface of the first housing 201. The configurations of the first housing 201 and the second housing 202 in FIG. 6, FIG. 7, FIG. 8, and/or FIG. 9 may be wholly or partially identical to those of the first housing 201 and the second housing 202 in FIG. 2, FIG. 3, and/or FIG. 4.

According to various embodiments, the electronic device 101 may include the first housing 201 and the second housing 202 slidable with respect to the first housing 201. The first housing 201 may include the first cover member 211 that provides an accommodation space for internal components (e.g., the battery 289), the frame 213 that supports an area of the display (e.g., the display 230 in FIG. 4), and the first rear plate 215 to cover the outer surface of the first cover member 211.

According to various embodiments, the battery 289 and a first circuit board 305 adjacent to the battery 289 may be disposed inside the first cover member 211 of the first housing 201. The first circuit board 305 may be a power circuit board (e.g., power PCB), and transmit power provided from the battery 289 to the main circuit board (e.g., the main circuit board 248 in FIG. 4) and/or another sub-circuit board (e.g., the second circuit board 301). For example, when the main circuit board 248 is disposed within the second housing 202 that slides with respect to the first housing 201, the electronic device 101 may further include a connection flexible power circuit board (FPCB) 306 which connects the first circuit board 305 and the main circuit board 248 to each other and is flexible according to the slide movement. In another example, when the sub-circuit board (e.g., the second circuit board 301) is disposed outside the first cover member 211 of the first housing 201, the second circuit board 301 may be implemented at least partially in a bent or inclined shape to be electrically connected to the first circuit board 305. A detailed description will be given of the shape of the first cover member 211 and the structure of the second circuit board 301, for connection to the first circuit board 305.

According to various embodiments, in the first housing 201, an electrical structure (e.g., the second circuit board 301 and/or the antenna module 302) may be disposed on the outer surface (e.g., a first surface F2 facing the −Z axis) of the first cover member 211. The first rear plate 215 may cover the first cover member 211 and the electrical structure so that they are not exposed to the outside, and may be coupled to the first surface F2 of the first cover member 211. For example, the second circuit board 301 and/or the antenna module 302 may be located between the first cover member 211 and the first rear plate 215.

According to an embodiment, the second circuit board 301 may be a sub-circuit board (e.g., the sub-circuit board 249 in FIG. 4) on which at least one electrical component is mounted or which is electrically connected to a conductive portion (e.g., an antenna) formed at one end of the first housing 201. The antenna module 302 may be an MFC antenna to wirelessly charge the battery 289 accommodated in the first housing 201. The antenna module 302 may include at least one wireless charging coil, terminals formed at one end of the at least one wireless charging coil, and/or a shielding member. The wireless charging coil may form at least one layer wound in a specified first shape with a first number of turns.

According to an embodiment, a recess 214 may be formed in at least one area of the first cover member 211. The recess 214 may be formed in a size corresponding to the second circuit board 301 and/or the antenna module 302. The second circuit board 301 and the antenna module 302 may be seated within the recess 214 of the first cover member 211. For example, at least a partial area of the second circuit board 301 may be located within the recess 214. In another example, the antenna module 302 may be located within the recess 214. According to an embodiment, the second circuit board 301 and the antenna module 302 may be formed as an integrated structure. For example, the antenna module 302 may at least partially extend from the second circuit board 301 and be electrically connected to the second circuit board 301.

According to various embodiments, the first cover member 211 may include a hole 214*a* formed in one area thereof. For example, the hole 214*a* may be formed on the first surface F2 of the first cover member 211. In another example, the hole 214*a* may be formed to penetrate the one area of the first cover member 211. According to an embodiment, at least a portion of the hole 214*a* may be located within the recess 214 formed on the first surface F2. For example, a portion of the hole 214*a* may be formed to overlap the recess 214, and the other portion of the hole 214*a* may be formed not to overlap the recess 214.

According to various embodiments, when the electronic device 101 is in the opened state, the first circuit board 305 mounted in an internal area of the first cover member 211 may be exposed to the outside of the first cover member 211 through the hole 214*a*. For example, the hole 214*a* may be formed in a portion of the first cover member 211 to correspond to a portion of the first circuit board 305. As the hole 214*a* is formed at a position corresponding to the first circuit board 305, when viewed toward the first surface F2 of the first cover member 211, a portion of the first circuit board 305 may be visually exposed through the hole 214*a*, and the exposed portion of the first circuit board 305 may be provided to form an electrical contact point with the second circuit board 301.

According to various embodiments, when the electronic device 101 is in the opened state, as the first circuit board 305 is visually exposed through the hole 214*a*, the first circuit board 305 and the second circuit board 301 may be easily coupled to each other. One end portion of the second circuit board 301 disposed in an outer area (e.g., the first surface F2) of the first cover member 211 may pass through the hole 214*a* and be electrically connected to the first circuit board 305 mounted in the internal area of the first cover member 211.

According to various embodiments, the electronic device 101 may include the second camera module 249*b* mounted within the second housing 202 (e.g., the second cover member). When the electronic device 101 is in the opened state, the second camera module 249*b* may be exposed to the outside by sliding together with the second housing 202 which slides relative to the first housing 201. When the electronic device 101 is in the closed state, the second camera module 249*b* may be exposed to the outside through a camera hole formed on the first cover member 211.

According to various embodiments (e.g., referring to FIG. 9), the second circuit board 301 may include a first portion 301*b* disposed at an edge of the first cover member 211, and a second portion 301*a* extending from one side of the first portion 301*b* toward the hole 214*a* formed on the first cover member 211. According to an embodiment, the second portion 301*a* may have a protruding shape extending substantially perpendicular to the first portion 301*b*, and one side of the second portion 301*a* may be connected to the antenna module 302. For example, the second portion 301*a* may be formed to be combined with the antenna module 302 into an integrated structure. The second portion 301*a* may be electrically connected to the antenna module 302, so that a signal provided from a signal line of the second portion 301*a* may be transmitted to the antenna module 302.

According to various embodiments, the second portion 301*a* may include a first connection portion 301*a*-1, a second connection portion 301*a*-2, a third connection portion 301*a*-3, a fourth connection portion 301*a*-4, a fifth connection portion 301*a*-5, a sixth connection portion 301*a*-6, and a seventh connection portion 301*a*-7.

According to an embodiment, the first connection portion 301*a*-1 may extend in a +Y-axis direction from the first portion 301*b* and be located in the recess 214 of the first cover member 211. One side of the first connection portion 301*a*-1 may be electrically connected to the antenna module 302.

According to an embodiment, the second connection portion 301*a*-2 may extend in the +Y-axis direction from one end of the first connection portion 301*a*-1, and at least a portion thereof may be bent toward the display (e.g., the display 230 in FIG. 4) (e.g., in a +Z-axis direction). For example, the second connection portion 301*a*-2 may be formed as an inclined surface with a specified inclination. As the second connection portion 301*a*-2 forms an inclined surface, it may be disposed to pass through the hole 214*a* of the first cover member 211. Accordingly, the first connection portion 301*a*-1 connected to one end of the second connection portion 301*a*-2 and the third connection portion 301*a*-3 connected to the other end of the second connection portion 301*a*-2 may be disposed on different parallel planes. For example, the first connection portion 301*a*-1 may be disposed to be seated outside (e.g., in the recess 224) the first cover member 211, and the third connection portion 301*a*-3 may be disposed inside the first cover member 211.

According to an embodiment, the third connection portion 301*a*-3 may be formed to extend in the +Y-axis direction from one end of the second connection portion 301*a*-2. The third connection portion 301*a*-3 may be located inside the first cover member 211 by the second connection portion 301*a*-2 bent to pass through the hole 214*a*. Accordingly, even though the second cover member (e.g., the second cover member 221 in FIG. 4) of the second housing 202, the rear cover (e.g., the rear cover 223 in FIG. 4), and the display 230 slide to overlap the first housing 201 in the closed state of the electronic device 101, the third connection portion 301*a*-3 may not cause mutual interference. As the third connection portion 301*a*-3 is located inside the first cover member 211, the second portion 301*a* may stably maintain electrical connection between the first circuit board 305 and the second circuit board 301.

According to an embodiment, the fourth connection portion 301*a*-4 may be formed to extend from one end of the third connection portion 301*a*-3 and bent in a-Y-axis direction opposite to the +Y-axis direction. As the fourth connection portion 301*a*-4 is bent, the fourth connection portion 301*a*-4 may provide a space accommodating one end of the second display area (e.g., the second display area A2 in FIG. 5A) of the display (e.g., the display 230 in FIG. 4), together with the third connection portion 301*a*-3 and the $(2\text{-}5)^{th}$ connection portion 301*a*-5. For example, when the electronic device 101 is in the closed state (e.g., see FIG. 5A), one end of the second display area A2 may be located within the space. When the electronic device 101 is in the opened state (e.g., see FIG. 5B), the one end of the second display area A2 may be disposed to be spaced apart from the space.

According to an embodiment, the fifth connection portion 301*a*-5 may be formed to extend in the −Y-axis direction from one end of the fourth connection portion 301*a*-4.

According to an embodiment, the sixth connection portion 301*a*-6 may be bent from one end of the fifth connection portion 301*a*-5 toward the display (e.g., the display 230 in FIG. 4) (e.g. in the +Z-axis direction). For example, the sixth connection portion 301*a*-6 may extend substantially perpendicular to the fifth connection portion 301*a*-5.

According to an embodiment, the seventh connection portion 301*a*-7 may be formed to extend in the −Y-axis direction from one end of the sixth connection portion 301*a*-6. A connection member may be disposed to couple the seventh connection portion 301*a*-7 and the first circuit board 305 and electrically connect them to each other. The connection member may include, for example, at least one of a coaxial cable connector, a board to board connector, an interposer, or a flexible printed circuit board (FPCB).

According to various embodiments of the disclosure, as the second circuit board 301 is electrically connected to the first circuit board 305 through the second portion 301*a*, an electrical element (a conductive portion of the first housing 201 and/or the antenna module 302) disposed on the outer surface of the first cover member 211 may be electrically connected to the first circuit board 305.

Figure 10:
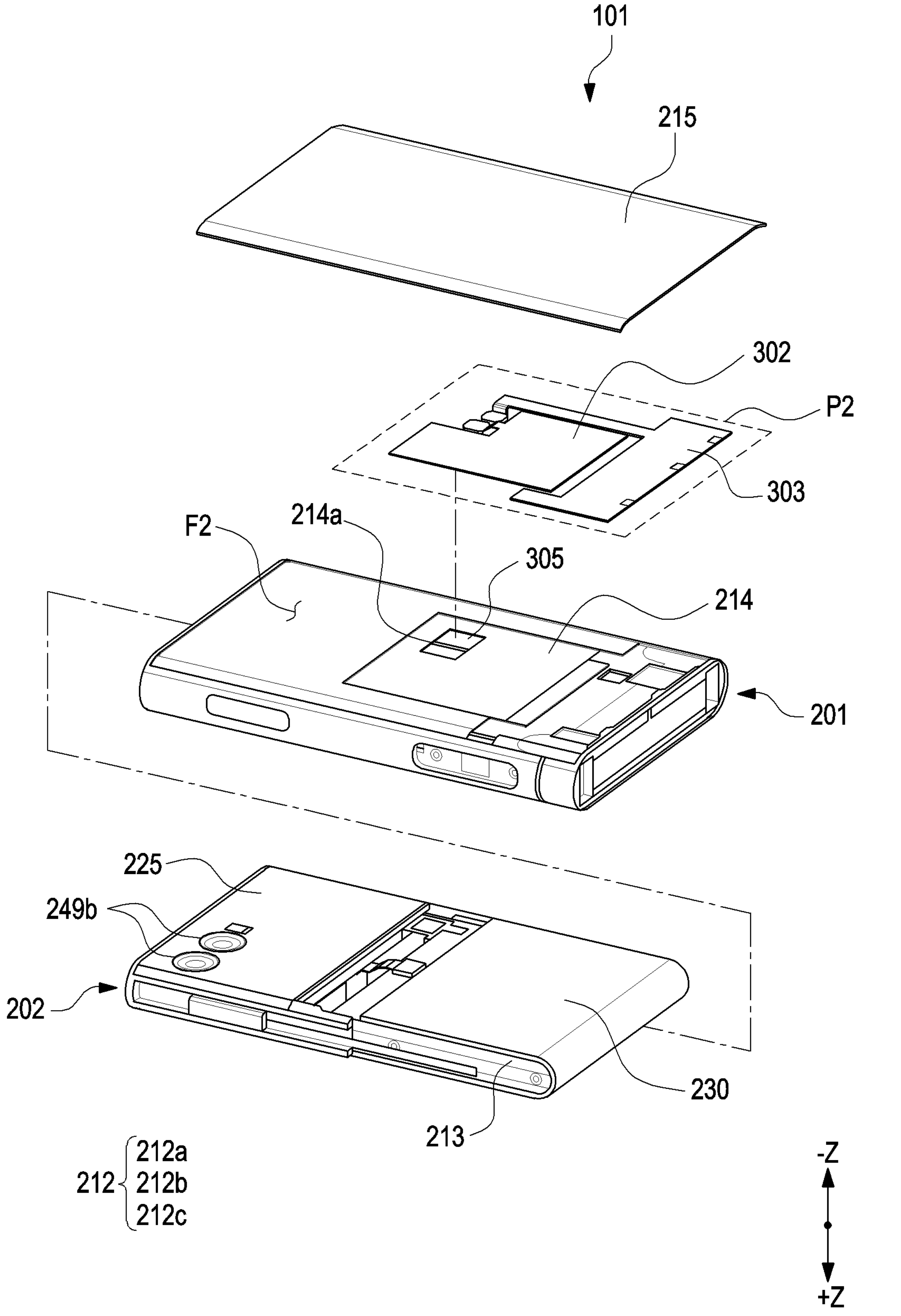
FIG. 10 is a disassembled perspective view illustrating a second circuit board and a first rear plate which are separated from a first cover member in a closed state of an electronic device according to various embodiments of the disclosure.

FIG. 10 is a disassembled perspective view illustrating a second circuit board and a first rear plate which are separated from a first cover member in a closed state of an electronic device according to various embodiments of the disclosure.

Figure 11:
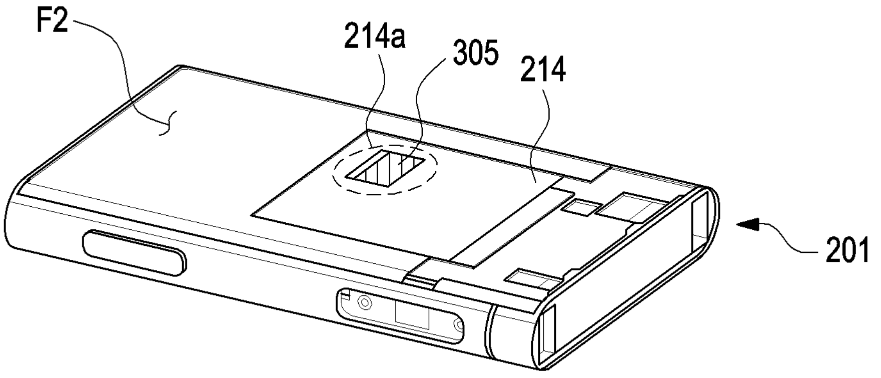
FIG. 11 is a diagram illustrating a bottom surface of an electronic device with a first rear plate excluded therefrom in a closed state of the electronic device according to various embodiments of the disclosure.

FIG. 11 is a diagram illustrating a bottom surface of the electronic device with the first rear plate excluded therefrom in the closed state of the electronic device according to various embodiments of the disclosure.

Figure 12:
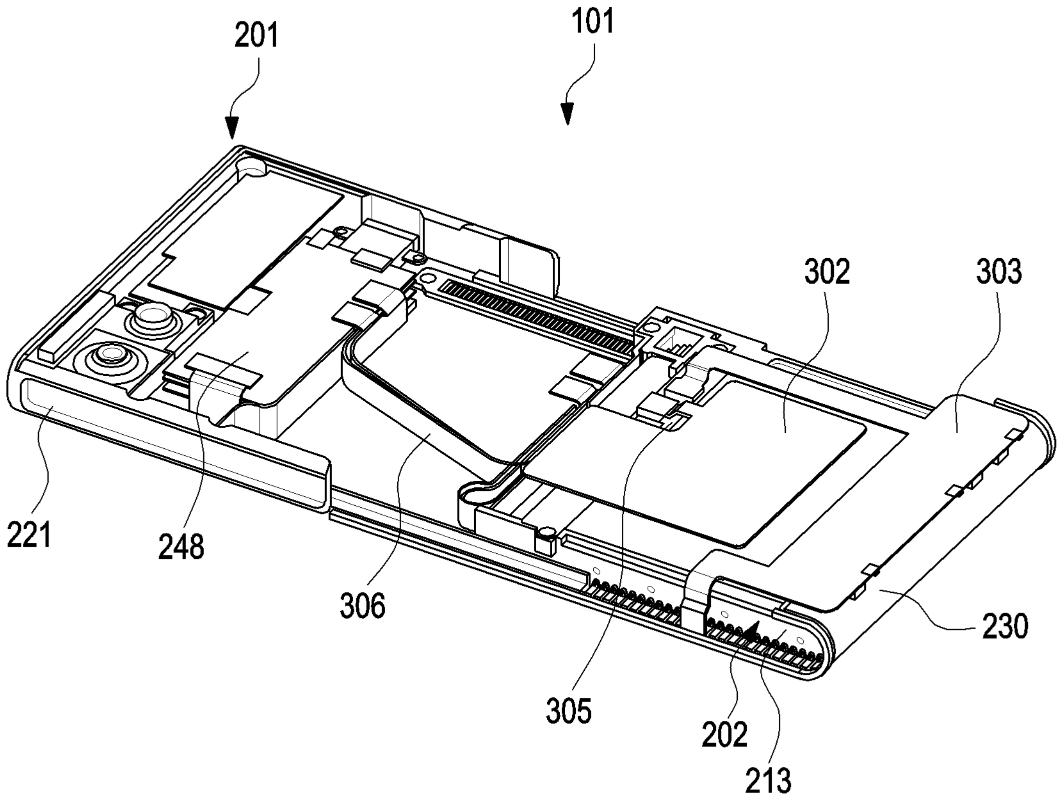
FIG. 12 is a perspective view illustrating the interior of an electronic device with a first rear plate and a first cover member excluded therefrom in an opened state of the electronic device according to various embodiments of the disclosure.

FIG. 12 is a perspective view illustrating the interior of the electronic device with the first rear plate and the first cover member excluded therefrom in the opened state of the electronic device according to various embodiments of the disclosure.

Figure 13A:
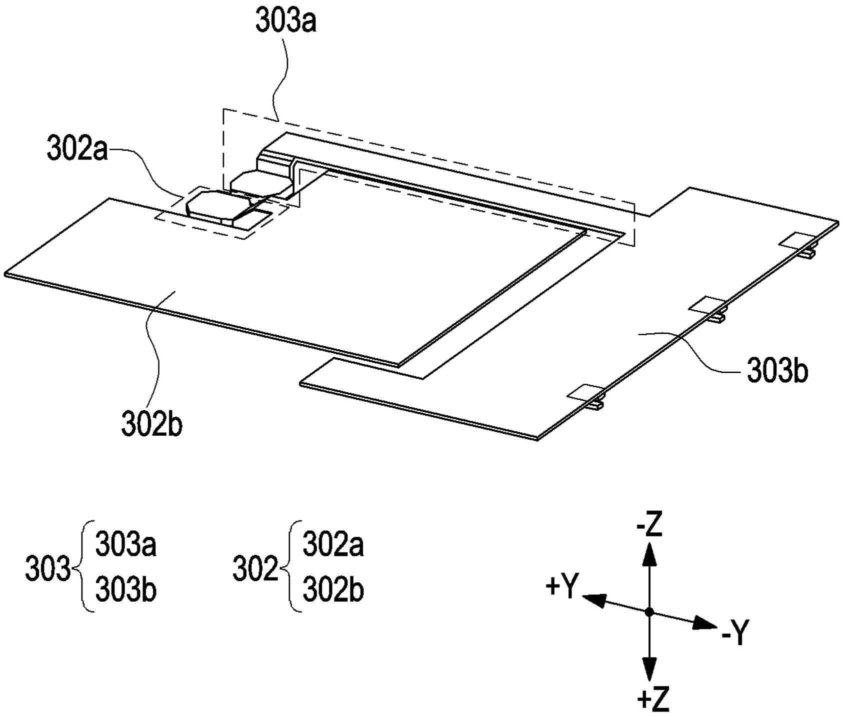
FIG. 13A is an enlarged perspective view illustrating a structure P2 of a second circuit board and antenna module in FIG. 6 according to various embodiments of the disclosure.

FIG. 13A is an enlarged perspective view illustrating a structure P2 of the second circuit board and antenna module of FIG. 6 according to various embodiments of the disclosure.

Figure 13B:
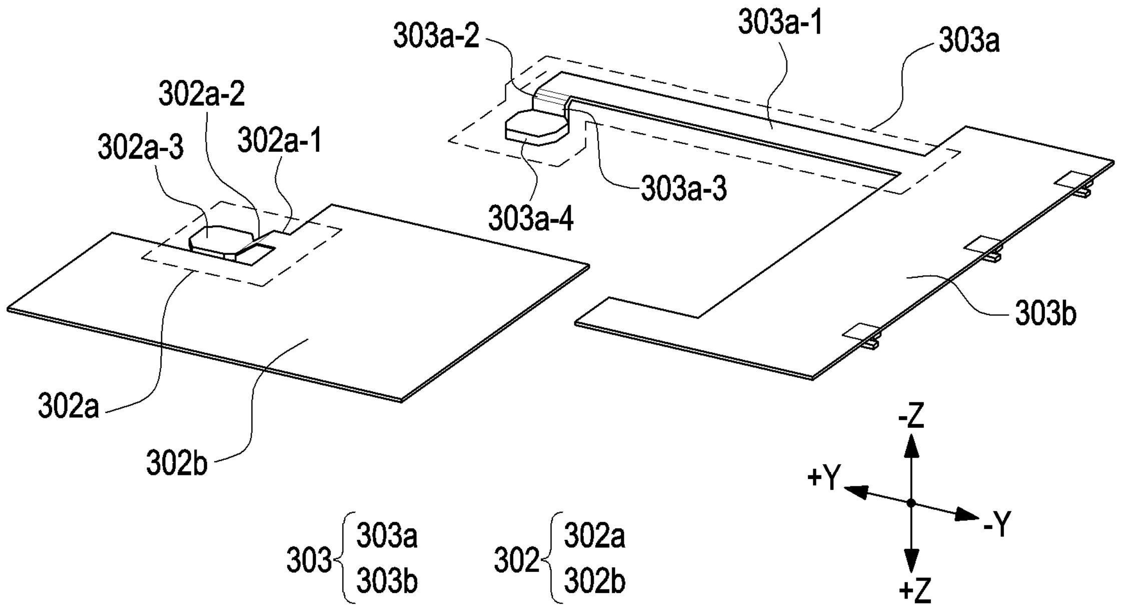
FIG. 13B is a disassembled perspective view illustrating the structure of the second circuit board and antenna module of FIG. 13A according to various embodiments of the disclosure.

FIG. 13B is a disassembled perspective view illustrating the structure of the second circuit board and antenna module of FIG. 13A according to various embodiments of the disclosure.

Referring to FIG. 10, FIG. 11, FIG. 12, FIG. 13A, and/or FIG. 13B, the electronic device 101 may include the first housing 201, the second housing 202, and an electrical structure (e.g., a third circuit board 303 and the antenna module 302) disposed on one surface of the first housing 201. The configurations of the first housing 201 and the second housing 202 in FIG. 10, FIG. 11, FIG. 12, FIG. 13A, and/or FIG. 13B may be wholly or partially identical to those of the first housing 201 and the second housing 202 in FIG. 2, FIG. 3, and/or FIG. 4.

According to various embodiments, the electronic device 101 may include the first housing 201 and the second housing 202 slidable with respect to the first housing 201. The first housing 201 may include the first cover member 211 that provides a space for accommodating internal components (e.g., the battery 289), the frame 213 that supports one area of the display 230, and the first rear plate 215 to cover the outer surface of the first cover member 211.

The configurations of the first cover member 211, the frame 213, and the first rear plate 215 of the first housing 201, the first circuit board 305, the second circuit board 301, and the antenna module 302 illustrated in FIG. 10, FIG. 11, FIG. 12, FIG. 13A, and/or FIG. 13B may be wholly or partially identical to those of the first cover member 211, the frame 213, the first rear plate 215, the first circuit board 305, the third circuit board 303, and the antenna module 302 illustrated in FIG. 6, FIG. 7, FIG. 8, and/or FIG. 9.

According to various embodiments, in the first housing 201, an electrical structure (e.g., the third circuit board 303 and/or the antenna module 302) may be disposed on the outer surface (e.g., the first surface F2 facing the −Z axis) of the first cover member 211. The first rear plate 215 may cover the first cover member 211 and the electrical structure so that they are not exposed to the outside, and may be coupled to the first surface F2 of the first cover member 211. For example, the third circuit board 303 and/or the antenna module 302 may be located between the first cover member 211 and the first rear plate 215. The third circuit board 303 may perform the same or similar function as the second circuit board 301 of FIG. 6, FIG. 7, FIG. 8, and/or FIG. 9.

According to an embodiment, the recess 214 may be formed in at least one area of the first cover member 211. At least a portion of the third circuit board 303 and the antenna module 302 may be seated within the recess 214 of the first cover member 211.

According to various embodiments, the first cover member 211 may include the hole 214*a* formed in one area thereof. For example, the hole 214*a* may be formed on the first surface F2 of the first cover member 211. In another example, the hole 214*a* may be formed to penetrate the one area of the first cover member 211. According to an embodiment, at least a portion of the hole 214*a* may be located within the recess 214 formed on the first surface F2.

According to various embodiments, the third circuit board 303 and the antenna module 302 may be separate structures. The third circuit board 303 and the antenna module 302 may be disposed spaced apart from each other and electrically connected to the first circuit board 305 through separate connection members, respectively. For example, a connection member may be formed on one end of the third circuit board 303 and form a contact point with an area of the first circuit board 305 exposed through the hole 214*a*. In another example, a connection member may be formed on one end of the antenna module 302 and form a contact point with an area of the first circuit board 305 exposed through the hole 214*a*.

According to various embodiments (e.g., referring to FIGS. 13A and 13B), the third circuit board 303 may include a first portion 303*b* disposed at an edge of the first cover member 211, and a second portion 303*a* extending from one side of the first portion 303*b* toward the hole 214*a* formed on the first cover member 211. According to an embodiment, the second portion 303*a* may have a protruding shape extending substantially perpendicular to the first portion 303*b*.

According to various embodiments (e.g., referring to FIGS. 13A and 13B), the antenna module 302 may include a first area 302*b* and a second area 302*a* extending from one side of the first area 302*b* toward the hole 214*a* formed on the first cover member 211. According to an embodiment, the second area 302*a* may have a protruding shape extending from the first area 302*b*. The antenna module 302 may be an MFC antenna to wirelessly charge the battery 289 accommodated in the first housing 201. The antenna module 302 may include at least one wireless charging coil, terminals formed at one end of the at least one wireless charging coil, and/or a shielding member. The wireless charging coil may form at least one layer wound in a specified first shape with a first number of turns.

According to various embodiments, the third circuit board 303 and the antenna module 302 may be separated from each other, the third circuit board 303 may be electrically connected to the first circuit board 305 through the second portion 303*a*, and the antenna module 302 may be electrically connected to the first circuit board 305 through the second area 302*a*.

According to various embodiments, the second portion 303*a* of the third circuit board 303 may include a first connection portion 303*a*-1, a second connection portion 303*a*-2, a third connection portion 303*a*-3, and a fourth connection portion 303*a*-4.

According to an embodiment, the first connection portion 303*a*-1 may extend in the +Y-axis direction from the first portion 303*b* and be located in the recess 214 of the first cover member 211.

According to an embodiment, the second connection portion 303*a*-2 may be bent at least partially toward the display (e.g., the display 230 in FIG. 4) (e.g., in the +Z-axis direction) to extend in a direction perpendicular to the +Y-axis direction from one end of the first connection portion 303*a*-1. As the second connection portion 303*a*-2 is formed to be bent, it may be disposed to pass through the hole 214*a* of the first cover member 211. Accordingly, the first connection portion 303*a*-1 connected to one end of the second connection portion 301*a*-2 and the third connection portion 303*a*-3 connected to the other end of the second connection portion 303*a*-2 may be disposed on different parallel planes.

According to an embodiment, the third connection portion 303*a*-3 may be located inside the first cover member 211 by the second connection portion 303*a*-2 bent to pass through the hole 214*a*. Accordingly, even though the second cover member (e.g., the second cover member 221 in FIG. 4) of the second housing 202, the rear cover (e.g., the rear cover 223 in FIG. 4), and the display 230 slide to overlap the first housing 201 in the closed state of the electronic device 101, the third connection portion 303*a*-3 may not cause mutual interference.

According to an embodiment, the fourth connection portion 303*a*-4 may be formed to extend from one end of the third connection portion 303*a*-3. A connection member may be disposed to couple the fourth connection portion 303*a*-4 and the first circuit board 305 and electrically connect them to each other. The connection member may include, for example, at least one of a coaxial cable connector, a board to board connector, an interposer, or an FPCB.

According to various embodiments, the second area 302*a* of the antenna module 302 may include a first connection area 302*a*-1, a second connection area 302*a*-2, and a third connection area 302*a*-3.

According to an embodiment, the first connection area 302*a*-1 of the antenna module 302 may extend in the +Y-axis direction from the first area 302*b* and be located within the recess 214 of the first cover member 211.

According to an embodiment, the second connection area 302*a*-2 may extend in the +Y-axis direction from one end of the first connection area 302*a*-1, and at least a portion thereof may be bent toward the display (e.g., the display 230 in FIG. 4) (e.g., in the +Z-axis direction). For example, the second connection area 302*a*-2 may be formed as an inclined surface with a specified inclination. As the second connection area 302*a*-2 forms an inclined surface, it may be disposed to pass through the hole 214*a* of the first cover member 211. Accordingly, the first connection area 302*a*-1 connected to one end of the second connection area 302*a*-2 and the third connection 302*a*-3 connected to the other end of the second connection area 302*a*-2 may be disposed on different parallel planes. For example, the first connection area 302a-1 may be disposed to be seated outside the first cover member 211 (e.g., in the recess 224), and the third connection area 302a-3 may be disposed inside the first cover member 211.

According to an embodiment, the third connection area 302a-3 may be formed to extend in the −Y-axis direction from one end of the second connection area 302a-2. A connection member may be disposed to couple and electrically connect the third connection area 302a-3 to the first circuit board 305. The connection member may include, for example, at least one of a coaxial cable connector, a board to board connector, an interposer, or an FPCB.

An electronic device (e.g., 101 in FIG. 6) according to various embodiments of the disclosure may include a first housing (e.g., 201 in FIG. 6) including a first support member (e.g., the frame 213 in FIG. 4) and a second support member (e.g., the first cover member 211 in FIG. 4), a second housing (e.g., 202 in FIG. 6) configured to slide relative to the first housing, a flexible display (e.g., 230 in FIG. 4) including a first display area (e.g., A1 in FIG. 4) and a second display area (e.g., A2 in FIG. 4) extending from the first display area, and configured to allow at least a portion of the second display area to be exposable based on the slide movement of the second housing, a first circuit board (305 in FIG. 6) disposed on the first support member, and a second circuit board (e.g., 301 in FIG. 6) disposed on the second support member. The second circuit board may be electrically connected to the first circuit board through a hole formed on one surface of the second support member.

According to various embodiments, at least a portion of the first circuit board may be disposed to face an inner surface of the second support member, and at least a portion of the second circuit board may be disposed on an outer surface of the second support member.

According to various embodiments, the first housing may further include a first rear plate (e.g., 215 in FIG. 6) to cover the one surface of the second support member. The second circuit board may be disposed between the second support member and the first rear plate.

According to various embodiments, at least a portion of the second circuit board may be seated in a recess (e.g., 214 in FIG. 6) formed on the one surface of the second support member, and the second circuit board may be electrically connected to a conductive portion formed at one end of the first housing.

According to various embodiments, the electronic device may further include an antenna module (e.g., 302 in FIG. 6) disposed on the one surface of the second support member and including a coil for wireless charging.

According to various embodiments, at least a portion of the antenna module may be electrically connected to the second circuit board, and the antenna module may be seated in a recess formed on the one surface of the second support member.

According to various embodiments, the second circuit board and the antenna module may be formed as an integrated structure. At least a portion of the antenna module may extend from the second circuit board, and a signal provided from a signal line of the second circuit board may be transmitted to the antenna module.

According to various embodiments, the electronic device may further include a battery (e.g., 289 in FIG. 4) disposed inside the first housing and electrically connected to the first circuit board, and the battery may be disposed to overlap the second circuit board with the one surface of the second support member interposed therebetween.

According to various embodiments, the electronic device may further include a main circuit board (e.g., 248 in FIG. 4) disposed inside the second housing and moving according to the second sliding of the second housing, and the first circuit board may be electrically connected to the main circuit board.

According to various embodiments, the second circuit board may include a first portion (e.g., 301b in FIG. 9) disposed at an edge of the one surface of the second support member, and a second portion (e.g., 301a in FIG. 9) extending from the first portion toward the hole. The second portion may include a plurality of bendable connection portions.

According to various embodiments, the second portion of the second circuit board may include a first connection portion (e.g., 301a-1 in FIG. 9) extending from the first portion in a first direction, a second connection portion (e.g., 301a-2 in FIG. 9) extending from the first connection portion in the first direction, and at least partially forming an inclined surface, and a third connection portion (e.g., 301a-3 in FIG. 9) extending from the second connection portion in the first direction, inserted into the hole, and located on a different plane from the first connection portion.

According to various embodiments, the second portion of the second circuit board may further include a fourth connection portion (e.g., 301a-4 in FIG. 9) extending from the third connection portion and bent in a second direction opposite to the first direction, a fifth connection portion (e.g., 301a-5 in FIG. 9) extending from the fourth connection portion in the second direction, a sixth (connection portion (e.g., 301a-6 in FIG. 9) extending substantially perpendicular to the fifth connection portion, and a seventh connection portion (e.g., 301a-7 in FIG. 9) on which a connection member for electrical connection to the first circuit board is disposed.

According to various embodiments, when viewed toward the one surface of the second support member, at least a portion of the first circuit board disposed inside the hole may be formed to be exposed.

According to various embodiments, in a closed state of the electronic device, one end portion of the second display area of the display may be disposed adjacent to the at least portion of the second circuit board. In an opened state of the electronic device, the one end portion of the second display area of the display may be disposed spaced apart from the at least portion of the second circuit board by sliding.

According to various embodiments, the second circuit board (e.g., the third circuit board 303 in FIG. 10) and the antenna module may be disposed spaced apart from each other, and at least a portion of the antenna module may be electrically connected to the first circuit board through the hole formed on the second support member.

According to various embodiments, the second circuit board may include a first portion disposed at an edge of the one surface of the second support member, and a second portion extending from the first portion toward the hole, and the second portion may include a plurality of bendable connection portions.

According to various embodiments, the second circuit board may include a first area (e.g., 302b in FIG. 13A) disposed at an edge of the one surface of the second support member, and a second area (e.g., 302a in FIG. 13A) extending from the first area toward the hole, and the second area may include a plurality of bendable connection portions.

An electronic device according to various embodiments of the disclosure may include a first housing (e.g., 201 in FIG. 6) including a first cover member to mount electrical components thereon, a second housing (e.g., 202 in FIG. 6) configured to slide relative to the first housing, a display (e.g., 230 in FIG. 4) including a first display area and a second display area extending from the first display area, and configured to allow at least a portion of the second display area to be exposable based on the slide movement of the second housing, a first circuit board (305 in FIG. 6) disposed inside the first cover member, a second circuit board (e.g., 301 in FIG. 6) disposed outside the first cover member, and an antenna module (302 in FIG. 6) connected to the second circuit board. At least a portion of the second circuit board may be electrically connected to the first circuit board through a hole formed on the first cover member.

According to various embodiments, at least a portion of the second circuit board may be seated in a recess formed on the first cover member, and the antenna module may be seated in the recess formed on the first cover member.

According to various embodiments, the second circuit board may be electrically connected to a conductive portion formed at one end of the first housing, and the antenna module may be an MFC antenna.

While a specific embodiment has been described in the detailed description of the disclosure, it will be apparent to those skilled in the art that many modifications are possible without departing from the scope of the disclosure.

The invention claimed is:

1. An electronic device comprising:

a first housing including a first support member and first cover member;

a second housing configured to slide with respect to the first housing;

a flexible display including a first display area and a second display area extending from the first display area, wherein at least a portion of the second display area is configured to be drawn into or drawn out of the first housing based on a slide movement of the second housing;

a first circuit board disposed on the first support member; and a second circuit board disposed on a rear portion of the first cover member, wherein, in a closed state of the electronic device, at least a portion of the second display area is disposed between the first support member and the rear portion of the first cover member, and wherein the second circuit board is electrically connected to the first circuit board through a hole formed in the rear portion of the first cover member.

2. The electronic device of claim 1, wherein at least a portion of the first circuit board is disposed to face an inner surface of the first cover member, and wherein at least a portion of the second circuit board is disposed on an rear surface of the first cover member.

3. The electronic device of claim 2, wherein the first housing further includes a first rear plate that covers the rear surface of the rear portion of the first cover member, and wherein the second circuit board is disposed between the first cover member and the first rear plate.

4. The electronic device of claim 2, wherein at least a portion of the second circuit board is seated on a recess formed on the rear surface of the rear portion of the first cover member, and wherein the second circuit board is electrically connected to a conductive portion formed at one end of the first housing.

5. The electronic device of claim 2, further comprising an antenna module disposed on the rear surface of the rear portion of the first cover member and including a coil for wireless charging.

6. The electronic device of claim 5, wherein at least a portion of the antenna module is electrically connected to the second circuit board, and the antenna module is seated on a recess formed on the rear surface of the rear portion of the first cover member.

7. The electronic device of claim 5, wherein the second circuit board and the antenna module are formed as an integrated structure, and wherein at least a portion of the antenna module extends from the second circuit board, and a signal provided from a signal line of the second circuit board is transmittable to the antenna module.

8. The electronic device of claim 5, wherein the second circuit board and the antenna module are spaced apart from each other, wherein at least a portion of the antenna module is electrically connected to the first circuit board through the hole formed on the first cover member, wherein the second circuit board includes a first portion disposed at an edge of the rear surface of the first cover member, and a second portion extending from the first portion toward the hole, and wherein the second portion includes a plurality of connection portions which are bendable.

9. The electronic device of claim 2, further comprising a battery disposed in the first housing and electrically connected to the first circuit board, wherein the battery is disposed to overlap the second circuit board with the one rear surface of the rear portion of the first cover member interposed therebetween.

10. The electronic device of claim 2, wherein when viewed from above the rear surface of the first cover member, at least a portion of the first circuit board disposed in the hole is formed to be exposed.

11. The electronic device of claim 1, further comprising a main circuit board disposed in the second housing and moving according to the second slide movement of the second housing, wherein the first circuit board is electrically connected to the main circuit board.

12. The electronic device of claim 1, wherein in a closed state of the electronic device, one end portion of the second display area of the display is disposed adjacent to the at least portion of the second circuit board, and wherein in an opened state of the electronic device, the one end portion of the second display area of the display is disposed spaced apart from the at least portion of the second circuit board by sliding.

13. The electronic device of claim 1, further comprising a motor configured to generate a driving force for the slide movement of the second housing.

14. The electronic device of claim 13, wherein the motor is affixed to the second housing and wherein the motor interacts with a rack that is connected to the first housing.

15. An electronic device comprising:

a first housing including a first support member and, a first cover member a second housing configured to slide with respect to the first housing;

a flexible display including a first display area and a second display area extending from the first display area, and wherein at least a portion of the second display area is configured to be exposable based on a slide movement of the second housing;

a first circuit board disposed on the first support member; and a second circuit board disposed on the first cover member, wherein the second circuit board is electrically connected to the first circuit board through a hole formed on one surface of the first cover member, wherein the second circuit board includes a first portion disposed at an edge of the one surface of the first cover member, and a second portion extending from the first portion toward the hole, and wherein the second portion includes a plurality of connection portions which are bendable.

16. The electronic device of claim 15, wherein the second portion includes:

a first connection portion extending from the first portion in a first direction;

a second connection portion extending from the first connection portion in the first direction, and at least partially forming an inclined surface; and a third connection portion extending from the second connection portion in the first direction, inserted into the hole, and located on a different plane from the first connection portion.

17. The electronic device of claim 16, wherein the second portion further includes:

a fourth connection portion extending from the third connection portion and bent in a second direction opposite to the first direction;

a fifth connection portion extending from the fourth connection portion in the second direction;

a sixth connection portion extending in a substantially perpendicular direction from the fifth connection portion; and a seventh connection portion on which a connection member for electrical connection to the first circuit board is disposed.

18. An electronic device comprising:

a first housing including a first support member and a first cover member;

a second housing configured to slide with respect to the first housing;

a flexible display including a first display area and a second display area extending from the first display area, wherein at least a portion of the second display area is configured to drawn into or drawn out of the first housing based on a slide movement of the second housing;

a first circuit board disposed on the first support member; and a second circuit board disposed on a rear portion of the first cover member, wherein, in a closed state of the electronic device, at least a portion of the second display area is disposed between the first support member and the rear portion of the first cover member, wherein the second circuit board is electrically connected to the first circuit board through a hole formed in the rear portion of the first cover member, wherein the second circuit board includes a first portion disposed at an edge of a rear surface of the first cover member, and a second portion extending from the first portion toward the hole, and wherein the second portion includes a plurality of connection portions which are bendable.

* * * * *